US008429502B2

(12) United States Patent
Lakkis

(10) Patent No.: US 8,429,502 B2
(45) Date of Patent: Apr. 23, 2013

(54) FRAME FORMAT FOR MILLIMETER-WAVE SYSTEMS

(75) Inventor: Ismail Lakkis, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1399 days.

(21) Appl. No.: 11/716,968

(22) Filed: Mar. 12, 2007

(65) Prior Publication Data

US 2007/0168841 A1 Jul. 19, 2007

(51) Int. Cl.
*H04L 7/00* (2006.01)
*H03M 13/05* (2006.01)

(52) U.S. Cl.
USPC .......................................... 714/775; 714/783

(58) Field of Classification Search ................... 714/783, 714/775
See application file for complete search history.

(56) References Cited

U.S. PATENT DOCUMENTS

| | | | |
|---|---|---|---|
| 3,622,982 A | 11/1971 | Clark, Jr. et al. | |
| 4,346,475 A * | 8/1982 | Alexis | 375/145 |
| 4,397,022 A | 8/1983 | Weng et al. | |
| 4,849,976 A | 7/1989 | Schilling et al. | |
| 4,901,317 A | 2/1990 | Rushforth et al. | |
| 4,926,422 A | 5/1990 | Alaria et al. | |
| 4,933,956 A | 6/1990 | Forney, Jr. | |
| 5,717,871 A | 2/1998 | Hsieh et al. | |
| 5,805,613 A | 9/1998 | Beery et al. | |
| 5,914,933 A * | 6/1999 | Cimini et al. | 370/208 |
| 5,968,199 A | 10/1999 | Khayrallah et al. | |
| 6,005,840 A * | 12/1999 | Awater et al. | 370/206 |
| 6,134,261 A * | 10/2000 | Ryan | 375/141 |
| 6,189,125 B1 | 2/2001 | Classon | |
| 6,324,668 B1 | 11/2001 | Classon | |
| 6,404,732 B1 * | 6/2002 | van Nee | 370/209 |
| 6,452,958 B1 * | 9/2002 | van Nee | 375/130 |
| 6,453,168 B1 * | 9/2002 | McCrady et al. | 455/517 |
| 6,567,482 B1 * | 5/2003 | Popovic' | 375/343 |
| 6,643,281 B1 * | 11/2003 | Ryan | 370/350 |
| 6,658,632 B1 | 12/2003 | Parulkar et al. | |
| 6,661,854 B2 * | 12/2003 | Rudolf et al. | 375/343 |

(Continued)

FOREIGN PATENT DOCUMENTS

EP 1953924 A1 8/2008
JP 2002280942 A 9/2002

(Continued)

OTHER PUBLICATIONS

Cheolhee Park et al: "Short-Range Wireless Communications for Next-Generation Networks: UWB, 60 GHz Milimiter-Wave WPAN, and ZigBee" IEEE Wireless Communications, IEEE Service Center, Piscataway, NJ, US, col. 14, No. 4, Aug. 1, 2007, XP011191781.

(Continued)

*Primary Examiner* — Stephen M Baker
(74) *Attorney, Agent, or Firm* — Dang M. Vo

(57) ABSTRACT

A single frame format is employed by a millimeter wave communication system for single-carrier and OFDM signaling. A Golay-coded sequence in the start frame delimiter (SFD) field identifies the data transmission as single carrier or OFDM. Complementary Golay codes are employed in a channel estimation field to allow a perfect estimate of the multipath channel to be made. Marker codes generated from Golay codes are inserted periodically between slots for tracking and/or for reacquiring timing, frequency, and multipath channel estimates. The length of the marker codes may be adapted relative to the multipath delay spread.

88 Claims, 19 Drawing Sheets

U.S. PATENT DOCUMENTS

| | | | | |
|---|---|---|---|---|
| 6,674,819 | B2* | 1/2004 | Rudolf et al. | 375/343 |
| 6,795,513 | B2* | 9/2004 | Jechoux et al. | 375/343 |
| 6,804,191 | B2* | 10/2004 | Richardson | 370/208 |
| 6,839,876 | B1* | 1/2005 | Tong et al. | 714/783 |
| 6,895,258 | B1 | 5/2005 | Scherzer et al. | |
| 6,922,406 | B2 | 7/2005 | Rudolf et al. | |
| 6,977,974 | B1* | 12/2005 | Geraniotis et al. | 375/340 |
| 6,996,418 | B2 | 2/2006 | Teo et al. | |
| 7,010,071 | B1* | 3/2006 | Michel et al. | 375/354 |
| 7,039,036 | B1* | 5/2006 | Dabak et al. | 370/342 |
| 7,042,868 | B2* | 5/2006 | Runkle et al. | 370/347 |
| 7,062,002 | B1* | 6/2006 | Michel et al. | 375/354 |
| 7,106,787 | B2* | 9/2006 | Chang et al. | 375/152 |
| 7,116,650 | B2 | 10/2006 | Takeuchi et al. | |
| 7,130,586 | B2 | 10/2006 | Corbett et al. | |
| 7,289,588 | B2* | 10/2007 | Suh et al. | 375/367 |
| 7,292,641 | B2* | 11/2007 | Suh et al. | 375/260 |
| 7,356,008 | B2* | 4/2008 | Mottier et al. | 370/335 |
| 7,400,654 | B2* | 7/2008 | Raaf | 370/514 |
| 7,483,367 | B2* | 1/2009 | Chayat et al. | 370/208 |
| 7,486,737 | B2* | 2/2009 | Trainin et al. | 375/260 |
| 7,508,866 | B2* | 3/2009 | Chang et al. | 375/152 |
| 7,616,622 | B2* | 11/2009 | Rudolf et al. | 370/350 |
| 7,680,230 | B2* | 3/2010 | Koppelaar | 375/368 |
| 7,684,473 | B2* | 3/2010 | Walton et al. | 375/150 |
| 7,711,032 | B2* | 5/2010 | Diaz Fuente | 375/146 |
| 7,817,967 | B2 | 10/2010 | Karabinis et al. | |
| 2004/0071195 | A1 | 4/2004 | Huang et al. | |
| 2004/0213145 | A1 | 10/2004 | Nakamura | |
| 2006/0245505 | A1 | 11/2006 | Limberg | |
| 2007/0014331 | A1 | 1/2007 | Eldon et al. | |
| 2007/0113159 | A1 | 5/2007 | Lakkis | |
| 2007/0245221 | A1 | 10/2007 | Lakkis | |
| 2009/0097533 | A1 | 4/2009 | Lakkis | |
| 2009/0100316 | A1 | 4/2009 | Lakkis | |
| 2009/0100317 | A1 | 4/2009 | Lakkis | |
| 2009/0110031 | A1 | 4/2009 | Lakkis | |
| 2009/0125792 | A1 | 5/2009 | Lakkis | |
| 2009/0201974 | A1 | 8/2009 | Song et al. | |
| 2011/0209035 | A1 | 8/2011 | Lakkis | |

FOREIGN PATENT DOCUMENTS

| | | | |
|---|---|---|---|
| JP | 2004515935 A | 5/2004 | |
| JP | 2004364285 A | 12/2004 | |
| WO | WO03047140 A1 | 6/2003 | |
| WO | WO2007056948 A1 | 5/2007 | |

OTHER PUBLICATIONS

Domenico Antonio Fittipaldi et al: "ieee 802.15,3c Medium Access Controller Throughput for Phased Array Systems" IEEE International Symposium on Personal Indoor and Mobile Radio Communications. PIMRC, IEEE; PI, XX Sep. 1, 2007 XP031168545.

Fumihide Kojima et al: "Necessary Modifications on Conventional IEEE802,15,3b MAC to Achieve IEEE802.15.3c Millimeter Wave WPAN" IEEE International Symposium on Personal, Indoor and Mobile Radio Communications. PIMRC, IEEE; PI, XX, Sep. 1, 2007, XP031168693.

Golay M J E: "Complementary Series" IRE Transactions on Information Theory, IEEE Inc. New York, US, vol. IT-07, No. 2, Apr. 1, 1961, XP009050014.

Guangqi Yang et al: "Design of Synchoronization Sequences in a MIMO Demonstration System" Wireless Communications and Applied Computational Electromagnetics. 20 05. IEEE/ACES International Conference on Honolulu, HI Apr. 3-7, 2005, Piscataway, NJ, USA, IEEE, Apr. 3, 2005, pp. 40-43, XP010826457.

Hiroshi Harada: "IEEE 802.15-07-0761-10-003c Unified and flexible millimeter wave WPAN systems supported by common mode" TG3C, Sep. 18, 2007 XP002508475.

Lakkis I. et al: "IEEE 8802.15-0760-03-003c mmWave OFDM Physical Layer Proposal" IEEE 802.15 TG3C, Sep. 19, 2007 19, XP002507726.

Nortel Networks: "Clarifications on Golay-Hadamard Sequence Based RACH Preamble" 3GPP Draft: R1-99C28, 3rd Generation Partnership Project (3GPP), Mobile Competence Centre; 650, Route des Lucioles; F-06921 Sophia-Anitpolis Cedex; France, vol. tsg_ran\WG1_RL1/TSGR1_07/Docs/Pdfs, No. Hannover; 19990830, Aug. 26, 1999, XP050089422.

Pengfei Xia et al: "Short Range Gigabit Wireless Communications Systems: Potentials, Challenges and Techniques" Ultra_Wideband, 2007, ICUWB 2007. IEEE International Conterence on, IEEE, PI Sep. 1, 2007 XP031159333.

Ryuhei Funada et al: "A design of single carrier based PHY for IEEE 802.15.3c standard" IEEE International Symposium on Personal Indoor and Mobile Radio Communications. PIMRC, IEEE;PI, XX, Sep. 1, 2007, XP031168950.

Sivaswamy, R. "Multiphase Complementary Codes," IEEE Transactions on Information Theory, vol. IT-24, No. 5, Sep. 1978.

IEEE 802.11b, "Part 11: Wireless LAN Medium Access Control (MAC) and Physical Layer (PHY) specifications: Higher-Speed Physical Layer Extension in the 2.4 GHz Band," Sep. 16, 1999.

Budisin, S.Z., "Efficient pulse compressor for Golay complementary seqences," Electronic Letters, 27, No. 3, pp. 219-220, Jan. 31, 1991.

IEEE 802.15.3c, "Part 15.3: Wireless Medium Access Control (MAC) and Physical Layer (PHY) Specifications for High Rate Wireless Personal Area Networks (WPANs)," Amendment 2: Millimeter-wave-based, Alternative Physical Layer Extension, (Amendment to IEEE Std 802.15.3-2003), Oct. 12, 2009, pp. 1-187.

Chung, "Optical Orthogonal codes: Design, Analysis and Applications", May 1989, IEEE vol. 35 No. 3, p. 595-604.

Bulumulla, "A systematic approach to detecting OFMD signals in a fading channel", May 2000, IEEE, Vo. 48 No. 5, pp. 1-4.

* cited by examiner

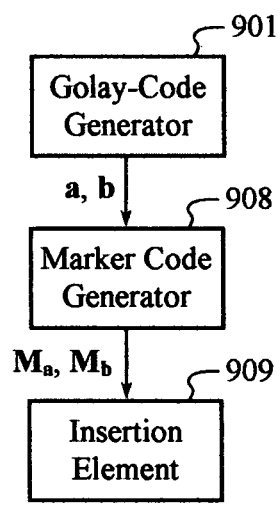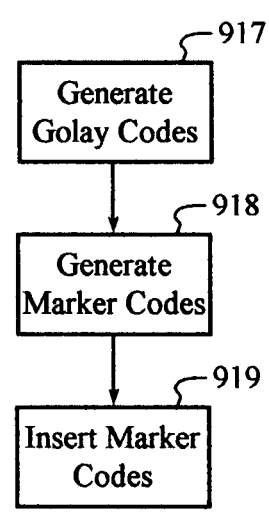
Figure 9E
Figure 9F

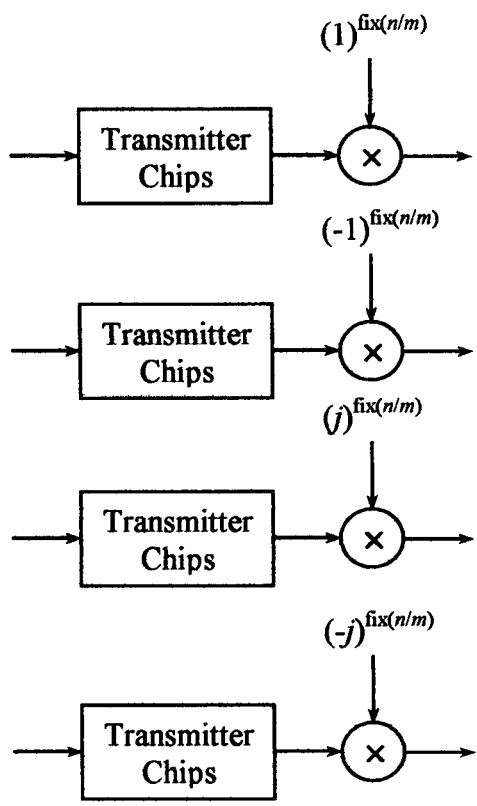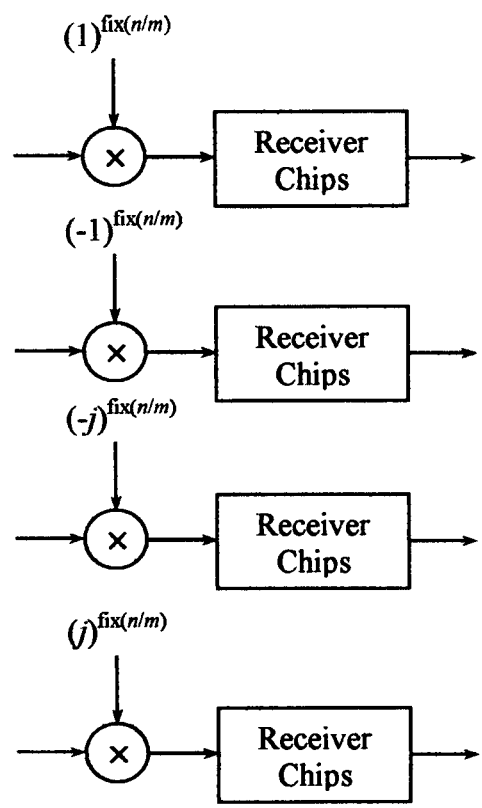
Figure 12A                    Figure 12B

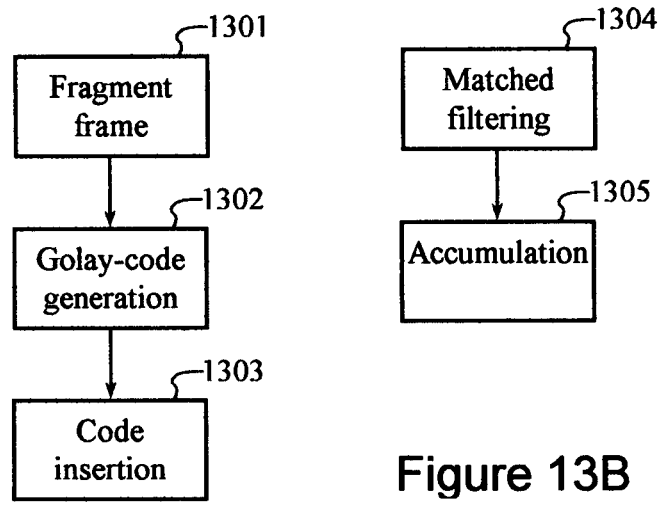
Figure 13A
Figure 13B
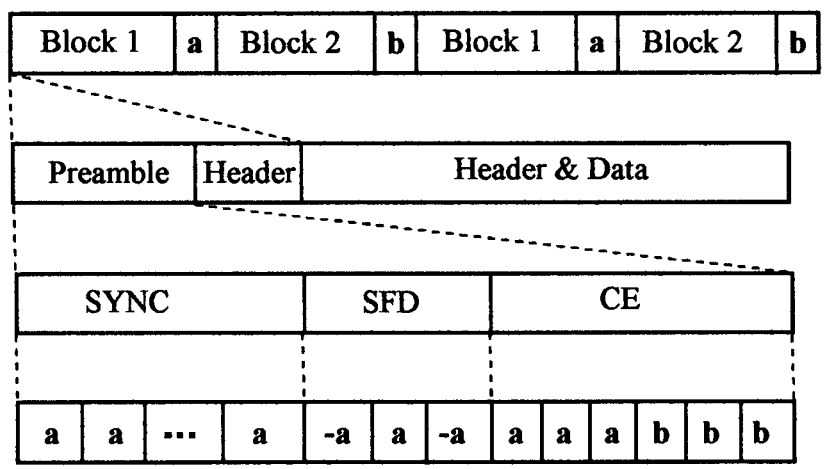
Figure 13C

FRAME FORMAT FOR MILLIMETER-WAVE SYSTEMS

CROSS-REFERENCE TO RELATED APPLICATION

This application claims priority to commonly owned and co-pending U.S. patent application Ser, No. 11/599,725, filed Nov. 15, 2006, which claims priority to U.S. patent application Ser. No. 60/737,065, filed Nov. 16, 2005, entitled "High Data Rated Ultra-Wide Band."

BACKGROUND OF THE INVENTION

I. Field of the Invention

The present invention relates generally to generating spread-spectrum coding, and particularly to generating and processing Golay codes for single carrier and OFDM transmissions.

II. Description of the Related Art

Within millimeter-wave communications, several different types of networks, each with their own communication protocols are envisioned. For example, there are Local Area Networks (LANs), Personal Area Networks (PANs), Wireless Personal Area Networks (WPANs), sensor networks and others. Each network may have its own communication protocol.

In one aspect of the related art, a Physical Layer supporting single carrier and OFDM modulation uses a common mode, which may be used for millimeter wave (e.g., 60 GHz) communications. In this case, the bandwidth is approximately 2.0 GHz, with a chip rate of 0.5 ns. Wireless communication systems using ultra-wideband (UWB) technology typically employ data multiplexing for allowing multiple users or devices to share access to the communication system. Some wireless communications systems are designed to support simultaneous data transmission among multiple devices and multiple groups of devices. A group or network of devices having data connection among each other is sometimes referred to as a piconet. A piconet is a logical group of two or more devices communicating with each other, without interference from other piconets. An exemplary piconet may be a DVD player with a UWB wireless link to a television display.

In wireless systems, it is often advantageous to support as many simultaneously operating piconets as possible. Multiple piconets typically require that data packets or symbols from devices on each piconet are multiplexed in a manner so data packets from one piconet are not readable to other piconets.

Widely used forms of multiplexing include frequency division multiple access (FDMA), where signals or data streams are each modulated onto unique portions of spectrum, and time division multiple access (TDMA), where data packets from different users or devices are assigned unique time slots in the same portion of spectrum.

One approach to data multiplexing in a UWB system uses code division multiple access (CDMA), a direct-sequence spread-spectrum system also used in cellular telephony, wireless LAN, and many other applications. CDMA multiplies user data to be transmitted with a unique spreading code. Each user or device is given a unique spreading code to differentiate its data stream from other users or devices. At the receiver, the original data is recovered via de-spreading with this unique code.

Code Division Multiple Access (CDMA) systems commonly suffer from multiple-access interference (MAI). When a user is assigned multiple orthogonalizing codes, signal degradation can take the form of inter-symbol interference (ISI). MAI and ISI are typically reduced by selecting orthogonalizing codes having low cross-correlations. However, in order to achieve good spreading characteristics in a DS-CDMA system, it is necessary to employ sequences having a low average mean-square aperiodic autocorrelation for non-zero lags.

In practice, decoding errors are minimized by using distinctive multiple-access codes with suitable autocorrelation and cross-correlation properties. The cross-correlation between any two codes should be low for minimal interference between multiple users in a communications system or between multiple target reflections in radar and positioning applications. At the same time, it is desirable for the autocorrelation property of a multiple-access code to be steeply peaked, with small side-lobes. Maximally peaked code autocorrelation yields optimal acquisition and synchronization properties for communications, radar, and positioning applications.

Complementary codes, first introduced by Golay, are sets of finite sequences of equal length such that the number of pairs of identical elements with any given separation in one sequence is equal to the number of pairs of unlike elements having the same separation in the other sequences.

The complementary codes first discussed by Golay were pairs of binary complementary codes. If values of +1 and −1 are elements of Golay complementary sequences, then the sum of the autocorrelation functions of two Golay complementary sequences has zero sidelobes. For a length-N code, the sum of its respective autocorrelation sequences for the zero shift is equal to K·N (K being the number of code words in the set).

Polyphase complementary codes, described in R. Sivaswamy, "Multiphase Complementary Codes," IEEE TRANSACTIONS ON INFORMATION THEORY, VOL. IT-24, NO. 5, September 1978, are codes where each element is a complex number of unit magnitude and arbitrary phase. In the IEEE 802.11b standard, complementary code elements include the set [1,−1, j,−j].

Unfortunately, favorable autocorrelation characteristics are typically achieved at the expense of cross-correlation characteristics, and vice versa. Thus, code selection typically involves a trade-off between autocorrelation and cross-correlation performance. It is advantageous to identify sets of spreading codes with autocorrelation and cross-correlation properties that facilitate identifying different piconets in a network. There is also a need in the art to provide simple transmitter and receiver structures that are configurable for a large number of codes and codes that may be employed in different transmission modes.

SUMMARY OF THE INVENTION

Embodiments disclosed herein may be advantageous to systems employing single-carrier and OFDM signals used in 60 GHz millimeter wave systems, such as defined by the IEEE802.15.3c protocol. However, the invention is not intended to be limited to such systems, as other applications may benefit from similar advantages.

In one embodiment of the invention, a millimeter wave transmission system comprises a Golay code generation means, a sequence generation means, and a spreading means. The Golay code generation means may include, by way of example, but without limitation, delay elements, seed vector insertion elements, multiplexers, and/or one or more combiners. The Golay code generation means may comprise a Golay complementary sequence pair generator and/or a Golay complementary sequence conjugate pair generator.

The sequence generation means is configured for generating at least one of a plurality of sequences, each of the plurality of sequences denoting one of a plurality of transmission modes. The sequence generation means may include, by way of example, but without limitation, a sequence generator configured for generating the plurality of sequences and/or a memory configured for storing the plurality of sequences.

The spreading means is configured for spreading at least one of the plurality of sequences with the at least one Golay code for producing at least one spread sequence, and selecting the at least one spread sequence in response to at least one transmission mode to generate at least one of a SYNC field and an SFD field. The spreading means may include, by way of example, but without limitation, a spreader, such as a multiplier configured to multiply a low-rate sequence with a high-rate spreading sequence. The spreading means may be configured for adding at least one of a cyclic prefix and a postfix to the at least one spread sequence.

In another embodiment, a millimeter wave receiver system comprises a Golay code generation means, a despreading means, and a sequence-detection means. The despreading means is configured for employing the at least one Golay code for despreading at least one of a SYNC field and an SFD field in a received signal to produce a despread sequence. The despreading means may include, by way of example, but without limitation, a multiplier and an integrator.

The sequence-detection means is configured for determining which of a plurality of transmission modes the despread sequence denotes. The sequence-detection means may include, by way of example, but without limitation, a comparator or a maximum likelihood detector configured for comparing the despread sequence to at least one reference sequence and producing a hard decision of whether a particular sequence is present in the received signal.

In yet another embodiment, a system configured for generating a sub-slot transmission sequence with at least one cyclic prefix comprises a Golay sequence generation means, a sub-slot sequence generation means, and a prefix generation means. In the case wherein the system employs an inverse Fourier transform of length N, the Golay sequence generation means produces at least one Golay sequence comprising M symbols, wherein M<N. The sub-slot sequence generation means is configured for generating a Golay-code modulated data sequence having a sub-slot length of N-M symbols. The sub-slot sequence generation means may include, by way of example, but without limitation, a multiplier configured to multiple each of a sequence of data symbols with the at least one code produced by the Golay sequence generation means. The prefix generation means is configured for employing the at least one Golay sequence to produce the at least one cyclic prefix such that each of the at least one cyclic prefix comprises M symbols. The cyclic prefix generation means may include, by way of example, but without limitation, a cyclic prefix prepender. The system may further comprise a postfix generation means configured to employ the at least one Golay sequence to generate at least one postfix of length M. The postfix generation means may comprise a cyclic postfix appender.

In an alternative embodiment, a millimeter wave transmission system comprises a Golay code generation means configured for generating a pair of complementary Golay codes, a sequence generation means configured for generating a channel-estimation sequence, and a spreading means configured for spreading the channel-estimation sequence with the pair of complementary Golay codes for producing at least one spread sequence configured for producing at least one Dirac pulse when combining matched-filter outputs at a receiver.

The sequence generation means may comprise, by way of example, but without limitation, a channel estimation sequence generator configured to employ complementary codes in a CE field of a frame.

In yet another embodiment, a millimeter wave receiver system comprises a Golay code generation means configured to produce a pair of complementary Golay codes, a matched filtering means configured to employ the complementary Golay codes for matched filtering a received signal comprising at least one channel-estimation sequence spread with the pair of complementary Golay codes, and a combining means configured for combining outputs of the matched-filtering means to produce at least one Dirac pulse. The matched filtering means may include, by way of example, but without limitation, a correlator and/or any method or apparatus configured to perform a convolution.

In another embodiment, a millimeter wave transmission system comprises a Golay code generation means, a marker-code generation means, and a code-insertion means. The marker-code generation means is configured for producing a plurality of marker codes from the at least one Golay codes. The marker-code generation means may include, by way of example, but without limitation, a marker-code generator configured for adapting the code length of the plurality of marker codes, a cyclic prefix generator, and/or a postfix generator. The code-insertion means may include, by way of example, but without limitation, a code-insertion element configured for periodically inserting the marker codes between data slots in a sequence of data slots to enable a receiver to perform at least one of a set of functions, comprising tracking, timing acquisition, frequency acquisition, and channel estimation.

In one embodiment, a millimeter wave receiver system comprises a Golay code generation means configured to produce at least one Golay code corresponding to at least one of a plurality of marker codes periodically inserted between data slots in a received transmission, and a synchronization engine means configured for employing the at least one Golay code to process the plurality of marker codes. The synchronization engine means may include, by way of example, but without limitation, a signal-tracking circuit, a timing acquisition circuit, a frequency acquisition circuit, and a channel estimation circuit. The synchronization engine means may be configured for measuring delay spread of the received transmission and reporting it back to a transmitter for adapting length of the marker codes. The synchronization engine means may be further configured for removing at least one of a cyclic prefix and a postfix from each of the plurality of marker codes.

Although particular embodiments are described herein, many variations and permutations of these embodiments fall within the scope and spirit of the invention. Although some benefits and advantages of the preferred embodiments are mentioned, the scope of the invention is not intended to be limited to particular benefits, uses, or objectives. Rather, embodiments of the invention are intended to be broadly applicable to different wireless technologies, system configurations, networks, and transmission protocols, some of which are illustrated by way of example in the figures and in the following description of the preferred embodiments. The detailed description and drawings are merely illustrative of the invention rather than limiting, the scope of the invention being defined by the appended claims and equivalents thereof.

BRIEF DESCRIPTION OF THE DRAWINGS

Embodiments according to the present invention are understood with reference to the following figures.

FIG. 9E illustrates components of a millimeter-wave transmitter configured for generating a channel-estimation sequence spread by at least one Golay code.

FIG. 9F illustrates a functional block diagram of a millimeter-wave transmitter in accordance with an embodiment of the invention.

FIG. 12A shows a set of self-synchronized scramblers for use in at least one piconet.

FIG. 12B illustrates a set of self-synchronized descramblers.

FIG. 13A illustrates a method for providing a millimeter-wave frame format that allows both open-loop and close-loop control to be used.

FIG. 13B shows a reception method in accordance with an embodiment of the invention.

FIG. 13C illustrates a frame format in accordance with one embodiment of the invention.

DESCRIPTION OF PREFERRED EMBODIMENTS

Figure 1:
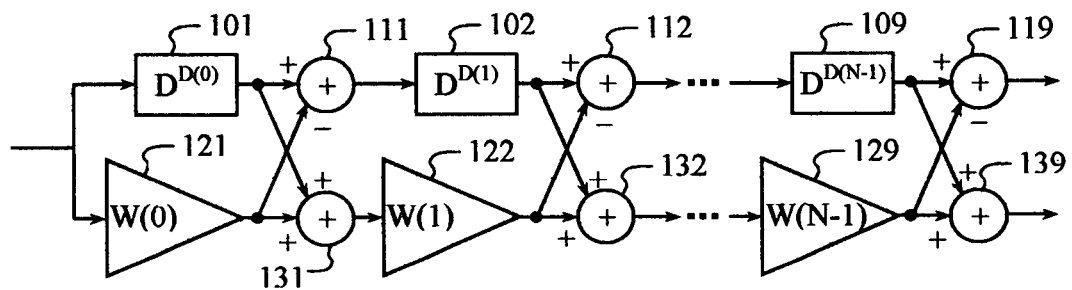
FIG. 1 is a diagram of a code generator configured to generate Golay complementary code pairs according to one embodiment of the invention.

While the invention is susceptible to various modifications and alternative forms, specific embodiments thereof have been shown by way of example in the drawings and are herein described in detail. It should be understood, however, that it is not intended to limit the invention to the particular form disclosed, but rather, the invention is to cover all modifications, equivalents, and alternatives falling within the spirit and scope of the invention as defined by the claims.

In accordance with one embodiment of the invention, a set of spreading codes is provided with autocorrelation and cross-correlation properties that are advantageous for identifying different piconets in a millimeter UWB network. For example, a set of six Golay complementary code pairs may be employed, and each piconet may be assigned one code pair.

FIG. 1 is a diagram of a code generator configured to generate Golay complementary code pairs according to one embodiment of the invention. The code generator comprises a sequence of delay elements 101-109 configured for providing a predetermined set of fixed delays $D=[D(0), D(1), \ldots, D(N-1)]$ to a first input signal. In this case, the delay profile provided by the delay elements 101-109 is fixed, even when the code generator is configured to produce multiple Golay complementary code pairs.

The code generator further comprises a sequence of adaptable seed vector insertion elements 121-129 configured for multiplying a second input signal by at least one of a plurality of different seed vectors $W^i=[W^i(0), W^i(1), \ldots, W^i(N-1)]$, $i=1, \ldots, L$, where L is the number of piconets, and, thus, code pairs. Thus, the code generator produces a set of 6 Golay complementary code pairs of length M (e.g., 64) as mother codes (one code pair per piconet) all having the same delay profile $D=[D(1), D(2), \ldots D(6)]$ but with different seed vectors $W_i=[W_{i1}, W_{i2}, \ldots, W_{i6}]$. The seed vectors may include any combination of binary and complex symbols. For binary codes, $W(k)=\pm 1$. For complex codes, $W(k)=\pm 1$ and $\pm j$.

The seed vector insertion elements 121-129 are programmable such that the seed vector, and the resulting Golay complementary code pair, is different for each of a plurality of piconets. Each of the plurality of seed vectors may correspond to at least one predetermined piconet. Furthermore, a first set of combiners 111-119 and a second set of combiners 131-139 are configured for combining delayed signals with signals multiplied by the seed vector.

In one embodiment, a set of six Golay code pairs is generated using a delay vector D=[32, 8, 2 16, 1, 4] and the following seed vectors:

$W^1 = [+1, +1, -j, +j, -j, +1]$
$W^2 = [+1, +1, -1, +1, +j, +j]$
$W^3 = [-j, +1, +1, -1, -1, +1]$
$W^4 = [+j, +j, -j, -1, +1, +1]$
$W^5 = [-1, +1, -1, -1, +j, +j]$
$W^6 = [+j, +1, +1, -1, -1, +j]$

The periodic cross correlation between the resulting Golay complementary codes is less that 16, and the periodic autocorrelation function has a zero-correlation zone (i.e., no side lobes) around the main correlation peak. Since the same delay vector is used to generate all six codes, and only the seed vector is configurable, code generators configured to generate different Golay complementary code pairs may share the same hardware configuration. Similarly, a code generator having a fixed hardware configuration may be programmable for generating pair codes for all piconets.

The first and second input signals may include a Dirac impulse signal [1, 0, . . . , 0]. The output comprises the complex-conjugate Golay-pair codes in reverse order. For example, the code generator may produce Golay complementary code pairs that are mother codes ($a^i_{64}$, $b^i_{64}$) of length 64.

In a low-data-rate mode, the mother-code pairs may be used to spread all fields in a frame. For example, a spreading module may comprise a spreader (not shown) and the code generator shown in FIG. 1. Mother-code pairs generated by the code generator may be used to spread the preamble, header, and data fields in the frame, thus allowing for a simple common mode in a millimeter UWB network.

Figure 2:
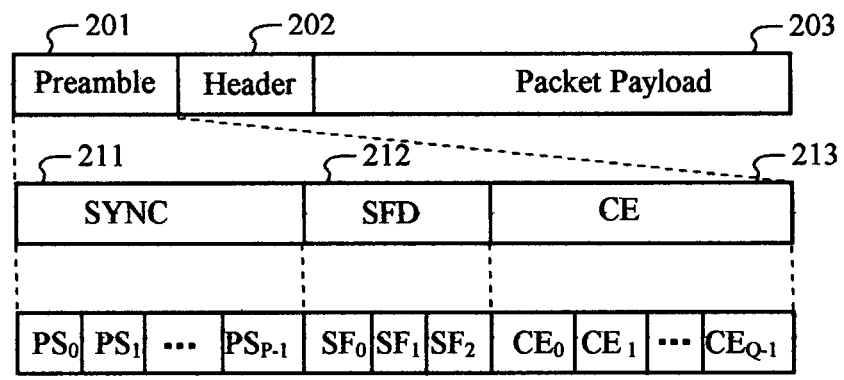
FIG. 2 shows an millimeter-wave frame structure that may be employed by embodiments of the invention.

FIG. 2 shows a millimeter UWB frame structure that may be employed by embodiments of the invention. A frame comprises a preamble 201, header 202, and packet payload 203. The preamble comprises a packet sync sequence field 211, a start-frame delimiter field 212, and a channel-estimation sequence field 213. The sync sequence 211 is a repetition of ones spread by Golay codes $a^i_{64}$ and/or $b^i_{64}$. The start-frame delimiter field 212 comprises a sequence {1 −1 1 −1 . . . } spread by $a^i_{64}$ and/or $b^i_{64}$. The channel-estimation field 213 may be spread using $a^i_{64}$ and/or $b^i_{64}$. In one embodiment, the channel-estimation sequence is formed by repetition of code $a^i_{64}$ followed by a repetition of code $b^i_{64}$. The header and data fields 202 and 203 may be binary or complex-valued, and spread using $a^i_{64}$ and/or $b^i_{64}$. Thus, embodiments of the invention may provide for employing a single spreader for spreading all fields in the frame. Use of a single spreader enables a simple low-cost low-complexity transmitter for a common mode millimeter-UWB network.

Figure 3:
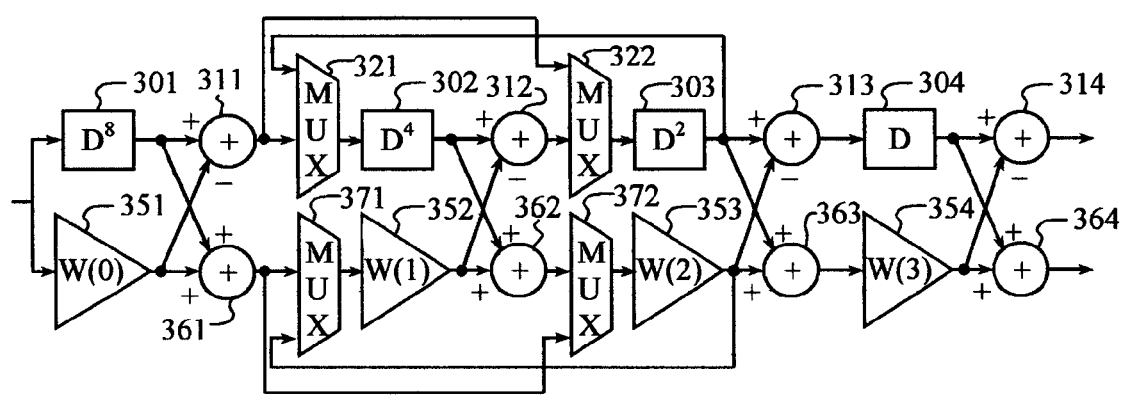
FIG. 3 is a diagram of a Golay-code generator configured for generating Golay complementary code pairs in accordance with an embodiment of the invention.

FIG. 3 illustrates a Golay-code generator configured for generating Golay complementary code pairs comprising a sequence of delay elements 301-304, a set of seed vector insertion elements 351-354, and a plurality of multiplexers 321, 322, 371, and 372. The sequence of delay elements 301-304 is configured for providing a predetermined set of fixed delays to at least a first input signal and at least one scaled signal for producing a plurality of delayed signals. The set of seed vector insertion elements 351-354 is configured for multiplying at least one input signal and at least one of the delayed signals by a programmable seed vector for producing at least one scaled signal. Furthermore, a first set of combiners 301-304 and a second set of combiners 361-364 are configured for combining delayed signals with scaled signals.

Each seed vector enables the code generator to generate a unique code pair corresponding to at least one predetermined piconet. However, the plurality of multiplexers 321, 322, 371, and 372 configures the delay elements to provide for a plurality of delay vectors, thus increasing the possible number of code pairs the generator can produce. For example, the multiplexers 321 and 322 provide for switching the inputs and outputs of delay elements 302 and 304, which produces a pair of compatible delay vectors. Compatible delay vectors are defined as a pair of delay vectors having identical delay-element values in which only two of the delay element values are swapped. For example, delay vectors $D_1$=[8, 4, 2, 1] and $D_2$=[8, 2, 4, 1] are compatible delay vectors.

The Golay-code generators shown in FIG. 1 and FIG. 3 may be configurable for producing Golay code pairs of different lengths. Specifically, sets of codes of different lengths having good autocorrelation and cross-correlation properties may be generated to support multiple data rates. Thus, each piconet may be provided with a code having a programmable length.

Figure 4:
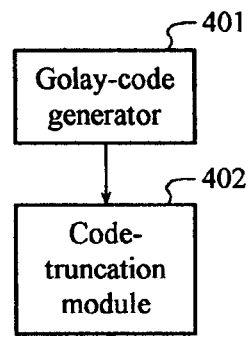
FIG. 4 illustrates a Golay-code generator configured to produce programmable-length codes.

FIG. 4 illustrates a Golay-code generator configured to produce programmable-length codes. A code generator 401, such as the code generator shown in FIG. 1 or FIG. 3, further comprises a code-truncation module 402. In this case, the code generator's 401 sequence of adaptable seed vector insertion elements is further configured for setting at least one seed-vector element value to zero. The code-truncation module 402 is configured to shorten the output Golay complementary code pairs (with respect to how many seed vector elements are set to zero) for producing a plurality of Golay complementary daughter code pairs, which may have different spreading lengths. Thus, the Golay-code generator shown in FIG. 4 can be used to generate all mother codes and daughter codes. Embodiments of the invention may be configured for generating code sets with good autocorrelation and cross-correlation properties to be used as spreading codes of programmable length to support multiple data rates.

In one embodiment of the invention, the Golay-code generator shown in FIG. 4 may be configured to produce a mother code of length 8 with a delay profile D=[8 4 2 1] and a seed vector W=[1 −1 1]. The resulting Golay code pairs are:

$a_8$=[+1 −1 −1 −1 −1 +1 −1 −1] and
$b_8$=[−1 −1 +1 −1 +1 +1 +1 −1].

The Golay-code generator may be further configured to produce a daughter code of length 4 with the same delay vector and a seed vector with the first element set to zero. For example, the seed vector W=[0 1 −1] may be used to generate the following Golay code pairs:

$a_{4'}$=[+1 +1 +1 −1 0 0 0 0] and
$b_{4'}$=[−1 +1 −1 −1 0 0 0 0].

By removing the zeros, daughter codes of length 4 are produced:

$a_4$=[+1 +1 +1 −1] and
$b_4$=[−1 +1 −1 −1].

Transmitter embodiments and receiver matched-filter embodiments of the invention may include any of the Golay-code generators described herein.

Figure 5:
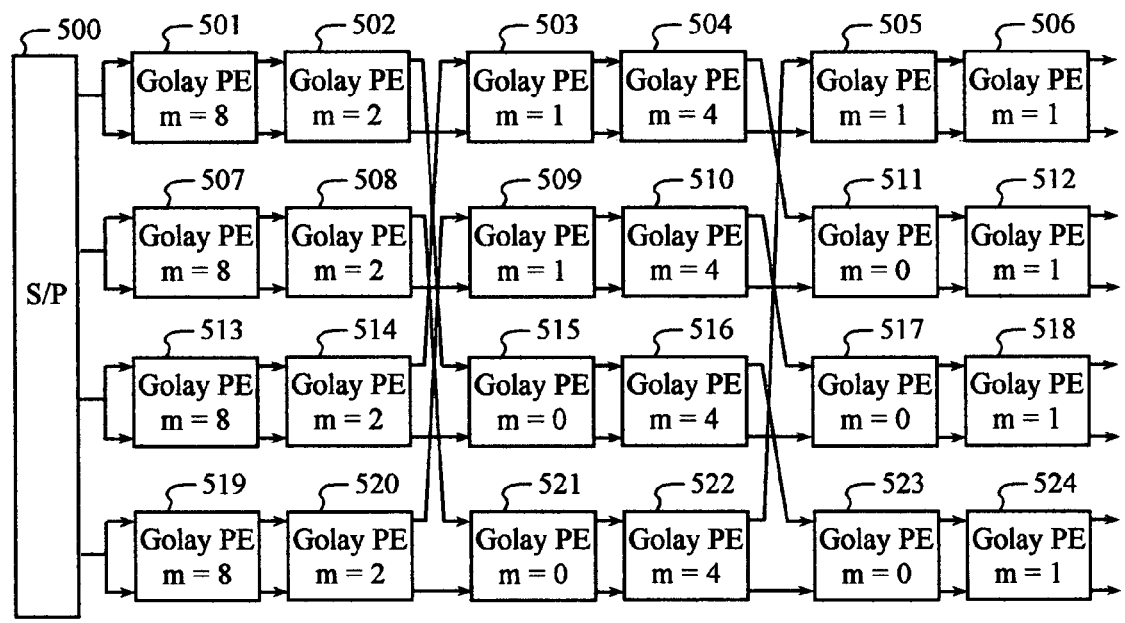
FIG. 5 shows a matched-filter circuit in accordance with an embodiment of the invention.

FIG. 5 shows a matched-filter circuit in accordance with an embodiment of the invention. A serial-to-parallel converter (S/P) 500 converts a received digital sequence into a plurality of parallel symbol streams. A plurality of Golay processing elements 501-524 provides for matched-filtering the received signal.

Embodiments of the invention may be configured for matched filtering Golay complementary code pairs having a common length or different lengths. The matched filter may be configured for processing all mother codes and/or daughter codes used by a plurality of piconets. In such embodiments, the matched filter may be configurable by programming at least one seed vector. Furthermore, the matched filter may be configured for decoding an entire frame, comprising a preamble, header, and packet payload.

Figure 6:
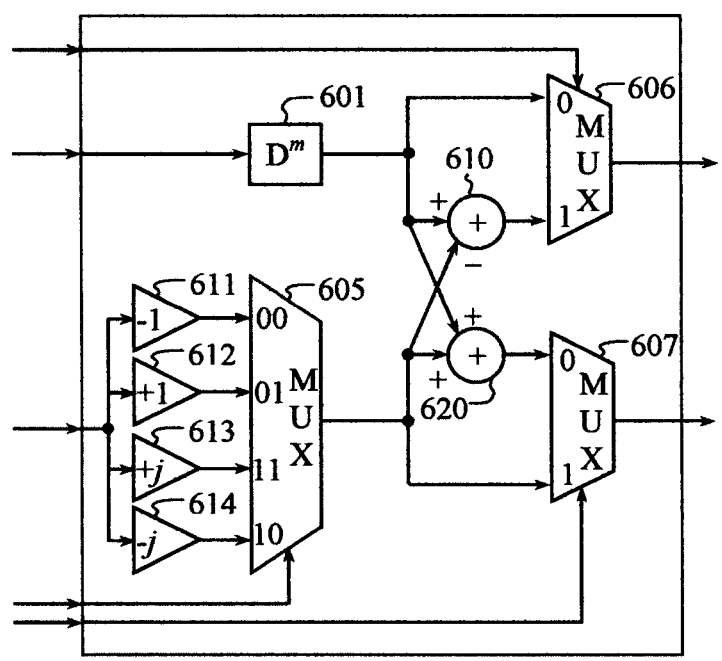
FIG. 6 is a block diagram of a Golay processing element.

FIG. 6 is a block diagram of one of the Golay processing elements 501-524 shown in FIG. 5. A first signal input is coupled to a delay element 601. A second signal input is coupled to a set of seed-vector insertion elements 611-614. A first multiplexer 605 is configured in one of the positions "00", "01", "11", or "10" depending on whether the current seed-vector value is −1, +1, +j, or −j, respectively. Multiplexers 606 and 607 are configured with respect to code length. For example, Multiplexers 606 and 607 are both in position "1" for a 64-length code and position "0" for a 32-length code.

The circuit is an exemplary implementation with a parallelism factor of four. The outputs represent a polyphase decomposition of the matched filter to Golay code pairs a and b. However, alternative embodiments of the invention may comprise different circuit configurations.

Figure 7A:
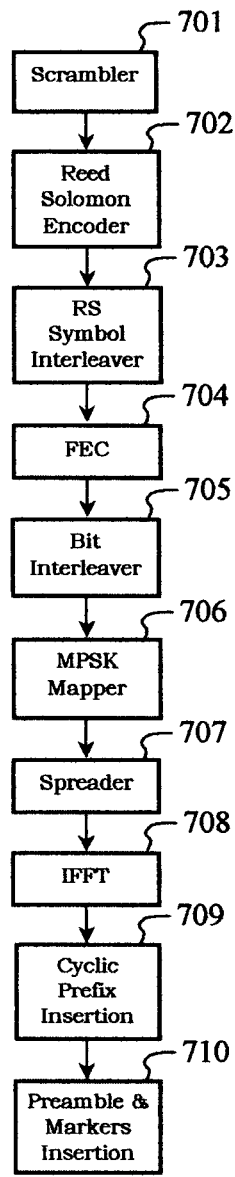
FIG. 7 is a block diagram of a transmitter configured for operating in a plurality of transmission modes.

FIG. 7 illustrates a transmitter configured for operating in a plurality of transmission modes. A scrambler 701 scrambles input data bits, which are processed by a Reed-Solomon encoder 702 and a symbol interleaver 703. A forward-error correction (FEC) coder 704 may employ Turbo LDPC or a parallel set of convolutional codes. Coded bits are interleaved by a bit interleaver 705 and processed by an MPSK mapper 706, which may support a combination of constellations, including BPSK, QPSK, 8PSK, and 16QAM. The resulting symbols are spread with Golay codes by a spreader 707.

An IFFT block 708 is employed in OFDM mode to modulate the spread symbols onto orthogonal subcarriers. Alternatively, the IFFT 708 is bypassed for single-carrier transmissions. At least one cyclic prefix may be inserted by a cyclic-prefix insertion block 709 for OFDM and/or single-carrier modes. A preamble and marker insertion block 710 inserts control symbols in the frame prior to transmission.

Figure 8A:
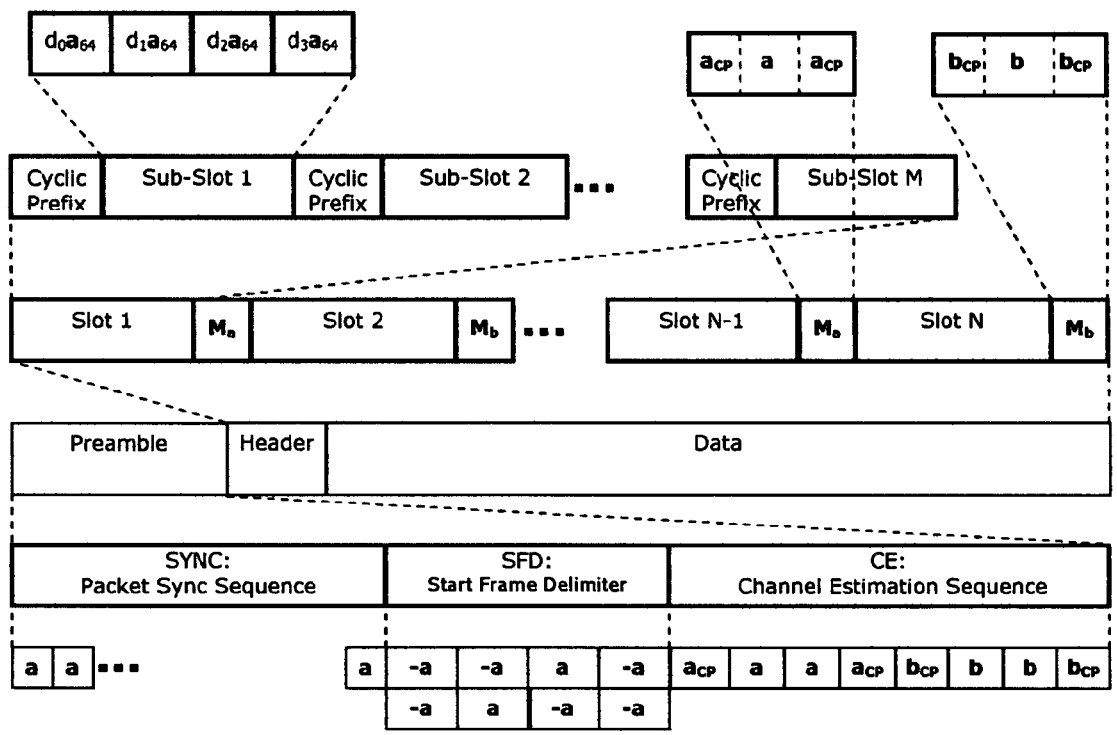
FIG. 8A illustrates a frame format that may be employed by embodiments of the present invention.

FIG. 8A illustrates a frame format that may be employed by embodiments of the present invention for either or both single-carrier and multicarrier (e.g., OFDM) transmissions. The SYNC field is a repetition of ones spread by Golay codes of length 256 (e.g., Golay codes a256 and/or b256). In one embodiment, the SFD field or both the SYNC and SFD fields may be coded to identify the following data as a single-carrier transmission or an OFDM transmission. For example, the SFD field may comprise a sequence {−1 −1 +1 −1} or {−1 +1 −1 −1} spread by a256 and/or b256. The first sequence {−1 +1 −1} may denote a single-carrier mode, whereas the second sequence {−1 −1 +−1} may denote an OFDM mode of operation. In one embodiment, the SFD and SYNC fields may be combined and employ a single code spread by Golay codes a256 and/or b256. Three different codes may be used to indicate single carrier, OFDM, and dual mode. It should be appreciated that other embodiments of the invention may employ alternative sequences and/or codes for denoting single-carrier, OFDM, and/or dual-mode operations. Additional transmission modes may be denoted by additional combinations of sequences and codes.

In one embodiment of the invention, a sequence may be employed to denote a single-carrier mode employing a substantially constant signal envelope. For example, a piconet controller may employ such a single-carrier mode for low-power communications in a line-of-sight channel, such as a channel between a cell phone and a laptop in which the propagation distance is small and the environment is substantially line-of-sight. This mode may employ π/2-BPSK modulation in which transmitted BPSK symbols alternate between the I and Q channels. One embodiment may employ a GSM waveform that is equivalent to pi/2-BPSK with a waveform of duration 3T and has a small amount of inter-symbol interference (ISI). In this case, the receiver may identify this mode and consequently employ a one-tap equalizer instead of a frequency-domain equalizer to process the constant-envelope waveforms, which typically have a non-flat frequency response.

The CE field may comprise a repetition of code a256 and/or b256, each having a variable or adaptable length cyclic prefix and postfix. The codes employed in the CE and data field may include different Golay codes than those used in the SFD and SYNC fields. In one embodiment, complementary codes a256 and b256 are employed in the CE because combining the matched filter outputs of a256 and b256 can provide a Dirac pulse (i.e., a pulse having no sidelobes), which allows for a perfect estimate of the multipath channel to be made.

In one embodiment of the invention, marker codes $M_a$ and $M_b$ are inserted periodically between slots for tracking and/or for reacquiring timing, frequency, and multipath channel estimates. The marker codes comprise at least one Golay code, and at least one of a cyclic prefix and a postfix. The marker codes allow the same synchronization engine to be employed for both single carrier and OFDM modes. Furthermore, by measuring the delay spread at the receiver and reporting it back to the transmitter, the length of the marker codes may be adapted. For example, the length of the marker codes may vary from a short length, which may be as small as zero for LOS (Line Of Sight) applications, to a long length covering worst case delay spread for multipath-rich environments.

Since a time-domain sequence that is repeated produces a frequency-interleaved spectrum (wherein the number of times the sequence is repeated equals the tone spacing of the corresponding OFDM signal), the marker codes may be configured to produce a spectrum corresponding to regularly spaced pilot tones in the OFDM signal. Properties of the pilot tones (such as tone spacing, frequency offset, tone strength, etc.) may be selected and/or adapted in the time domain via corresponding selections of marker code properties. For example, repeating a Golay sequence of length 64 four times instead of employing a single Golay sequence of length 256 produces pilots that are four times stronger in the frequency domain and have a four-tone separation. If a flat frequency spectrum is desired, the amplitude of the repeated Golay sequence may be appropriately reduced.

The header and data fields may comprise binary (+1 and −1) values spread by Golay codes aM and/or bM or complex-valued (e.g., +1, −1, +j and −j) spread by Golay codes aM and/or bM, where M denotes an integer length of the Golay codes. The value M may be adaptable to support different data rates. In some embodiments, a common mode (with M=64, for example) may be chosen for both single-carrier and OFDM modes.

Figure 8B:
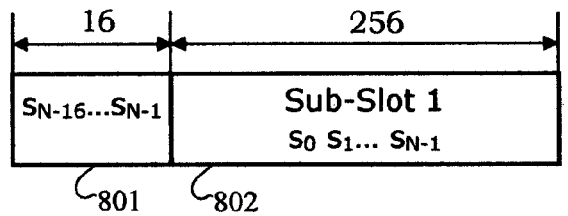
FIG. 8B illustrates an exemplary cyclic prefix in accordance with one aspect of the invention.

Each slot comprises a plurality of sub-slots, wherein each sub-slot comprises a Golay-code modulated data sequence. For example, the Golay-code modulated data sequence may comprise $\{a_{64}d_0, a_{64}d_1, a_{64}d_2, a_{64}d_3\}$. Each sub-slot may further comprise at least one of a cyclic prefix and a cyclic postfix. Assuming an FFT length of 256 and a channel delay of 16 symbols, the last 16 symbols of the 256-length sub-slot are typically copied and appended to the front of the sub-slot 802 as a cyclic prefix 801, such as shown in FIG. 8B. This copy is necessary to make the convolution cyclic, but it is not used in any other way.

Figure 8C:
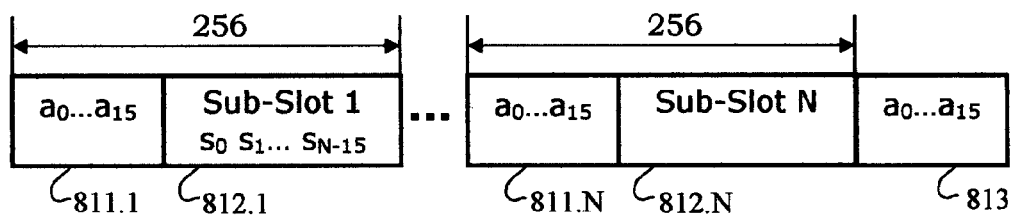
FIG. 8C illustrates a cyclic prefix and a postfix configuration that may be employed in accordance with an embodiment of the invention.

FIG. 8C illustrates an alternative embodiment of the invention in which the sub-slot length may be reduced by the channel delay. The term channel delay, as used herein, is meant to include any evaluation of channel delay, including, but not limited to, mean delay, maximum delay, root-meansquared (rms) delay spread, average rms delay spread, and mean delay spread. For example, the sub-slot 812.1 length may be 256−16=240 symbols. A Golay sequence of length 16 is used as the prefix 811.1, and a postfix 813 is appended to the last sub-slot 812.N of the sequence of sub-slots. In this embodiment, the Golay sequence is the same for all sub-slots 812.1-812.N. In other embodiments, the Golay sequences employed in cyclic prefixes may alternate between sequences a and sequence b for even and odd symbols. In this case, the convolution is still cyclic, so equalization in the frequency domain is still provided. However, the cyclic prefix 811 and postfix 813 can now be used to track the channel and timing and frequency offsets using the Golay receiver of the present invention. It is anticipated that this embodiment may be adapted to alternative FFT lengths, channel delay spreads, and/or Golay code lengths without departing from the spirit and scope of the present invention.

Figure 8D:
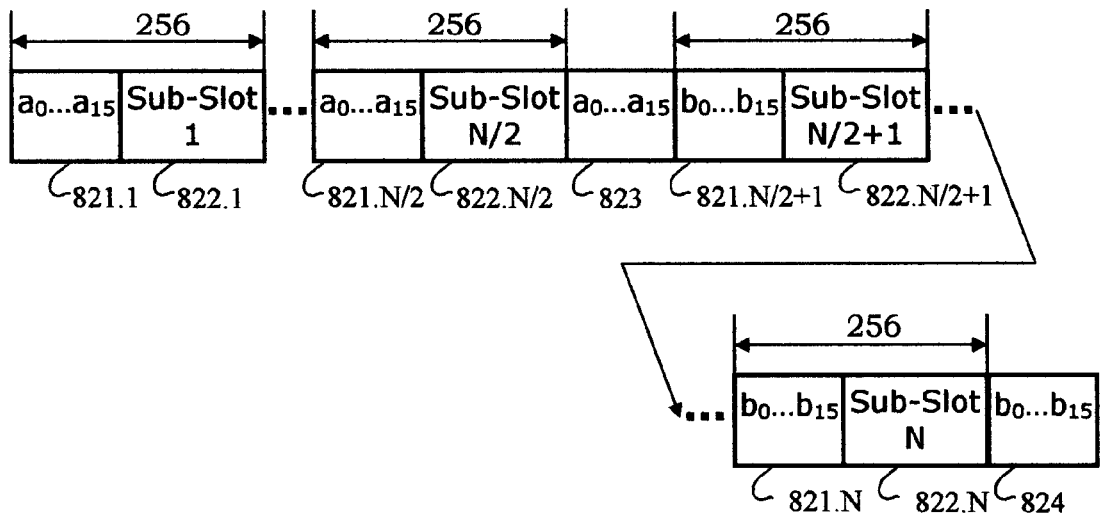
FIG. 8D shows a cyclic prefix and postfix configuration in accordance with yet another embodiment of the invention.

FIG. 8D illustrates an embodiment of the invention in which each of the first N/2 sub-slots 822.1-822.N/2 employs a first complementary Golay code a as a prefix 821.1-821.N/2, respectively. Each of the next N/2 sub-slots 822.(N/2+1)-822.N employs a second complementary Golay code b as a prefix 821.(N/2−1)-821.N, respectively. Furthermore, sub-slot 822.N/2 employs a postfix 823, and sub-slot 822.N employs a postfix 824.

Each sub-slot may comprise a single-carrier or an OFDM signal. However, the sub-slot length may differ for each mode. Furthermore, sub-slot length may vary, such as with respect to channel conditions, or various alternative parameters.

In one embodiment, an apparatus is configured for generating a sub-slot transmission sequence with a cyclic prefix and a cyclic postfix. In the case wherein the apparatus employs a Fourier transform of length N, a Golay sequence generator is configured for generating a Golay sequence comprising M symbols, wherein M<N. A sub-slot sequence generator produces a Golay-code modulated data sequence having a sub-slot length of N−M symbols, and a cyclic prefix and postfix generator employs the Golay sequence to produce the cyclic prefix and the cyclic postfix, wherein each of the cyclic prefix and the cyclic postfix comprises M symbols.

Embodiments of the invention may employ a single spreader for generating Golay codes and providing the codes to a plurality of the fields shown in the frame depicted in FIG. 3. In one embodiment, a transmitter in an IEEE802.15.3c network employs a single Golay code generator (which may comprise hardware and/or software) to provide Golay codes to all of the fields.

Figure 9A:
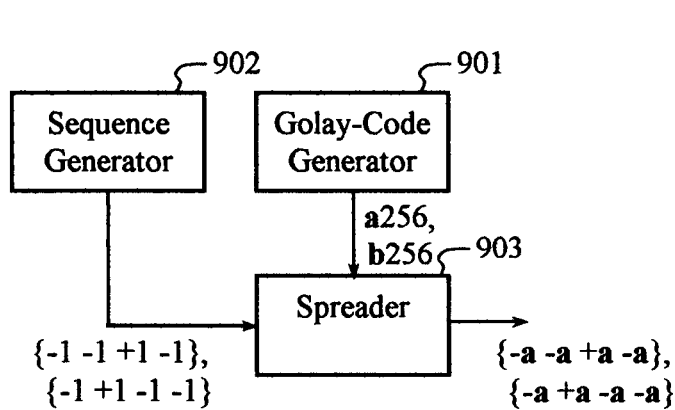
FIG. 9A illustrates components of a millimeter-wave transmitter configured for generating an SFD sequence spread by at least one Golay code.

FIG. 9A illustrates components of a millimeter-wave transmitter configured for generating an SFD sequence spread by at least one Golay code. The transmitter comprises a Golay-code generator 901, an SFD sequence generator 902, and a spreader 903. The transmitter may be implemented within the preamble and marker insertion block 910 shown in FIG. 7. The Golay-code generator 901 is configured for producing at least one Golay code for spreading at least one of a plurality of sequences produced by the sequence generator 902. For example, Golay codes a256 and b256 may be produced. Each sequence may be used to denote a particular operating mode of the transmitter. For example, the SFD field may comprise a sequence {−1 −1 +1 −1} to denote a single-carrier mode and/or {−1 +1 −1 −1} to denote an OFDM mode. Alternative operating modes, such as a dual mode, may be denoted by alternative sequences. Furthermore, Golay codes used for spreading the sequences may be selected to convey information. Thus, a receiver may be configured to despread the SFD sequence in a received signal in order to determine the transmission mode employed by the transmitter. The receiver may be configured to adapt how it processes a received signal based on the transmission mode.

In one embodiment, the sequence generator 902 may be configured to produce sequences for both the SFD and SYNC fields, which may be spread using the same Golay code. Although the Golay-code generator 901, the sequence generator 902, and the spreader 903 are described with respect to generating at least one Golay-coded SFD sequence, one or more of these components may additionally be configured for processing other fields in a frame.

Figure 9B:
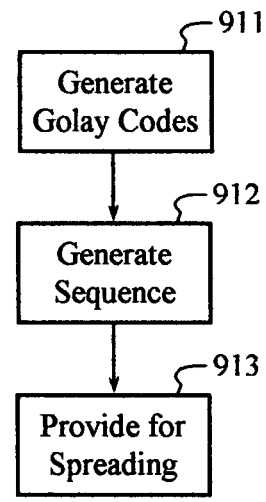
FIG. 9B illustrates a functional block diagram of a millimeter-wave transmitter in accordance with one embodiment of the invention.

FIG. 9B illustrates a functional block diagram of a millimeter-wave transmitter in accordance with one embodiment of the invention. Golay codes are generated 911 and used to spread 913 at least one sequence produced in a sequence-generation step 912. The order of the steps 911 and 912 may be swapped, or the steps 911 and 912 may be performed concurrently. In some embodiments, a single apparatus may be employed for performing two or more of the steps 911-913.

Figure 9C:
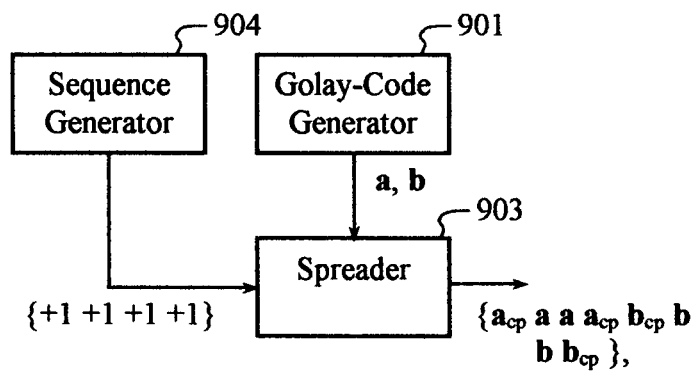
FIG. 9C illustrates components of a millimeter-wave transmitter configured for generating a channel-estimation sequence spread by at least one Golay code.

FIG. 9C illustrates components of a millimeter-wave transmitter configured for generating a channel-estimation sequence spread by at least one Golay code. The transmitter comprises a Golay-code generator 901, a sequence generator 904, and a spreader 903, which may be implemented within the preamble and marker insertion block 910 shown in FIG. 7. The Golay-code generator 901 is configured for producing at least one Golay code for spreading a channel-estimation sequence produced by the sequence generator 904. The sequence generator may be configured to generate a sequence of all ones. Thus, the novel structure of the CE field may be introduced by the spreader 903, which may provide for repeating the Golay code a256 and/or b256, and may further provide for at least one variable or adaptable length cyclic prefix and postfix.

In one embodiment, the Golay-code generator 901 produces complementary codes a256 and b256 because combining the matched-filter outputs of a256 and b256 can provide a Dirac pulse (i.e., a pulse having no sidelobes), which allows for a perfect estimate of the multipath channel to be made at a receiver. It should be appreciated that alternative Golay codes may be employed, and that such alternative codes may be selected to enable perfect channel estimation at the receiver.

Although the Golay-code generator 901, the sequence generator 904, and the spreader 903 are described with respect to generating at least one Golay-coded CE sequence, one or more of these components may additionally be configured for processing other fields in a frame.

Figure 9D:
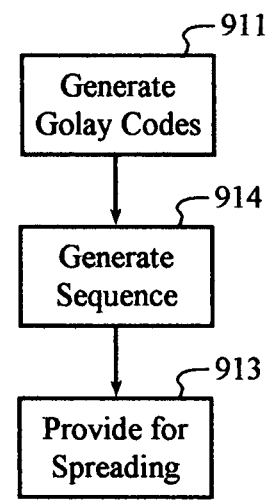
FIG. 9D illustrates a functional block diagram of a millimeter-wave transmitter in accordance with an embodiment of the invention.

FIG. 9D illustrates a functional block diagram of a millimeter-wave transmitter in accordance with an embodiment of the invention. Golay codes are generated 911 and used to spread 913 at least one channel-estimation sequence produced in a sequence-generation step 914. The order of the steps 911 and 914 may be swapped, or the steps 911 and 914 may be performed concurrently. In some embodiments, a single apparatus may be employed for performing two or more of the steps 911-913. Alternatively, the channel-estimation sequence may simply comprise a predetermined ordering of Golay codes used by the spreader 903 in FIG. 9C to generate a spread (i.e., Golay coded) CE sequence. In this case, the sequence-generation step 914 may be incorporated into Golay code generation 911 or spreading 913. Spreading 913 may further comprise inserting at least one cyclic prefix and/or at least one postfix in the spread sequence.

FIG. 9E illustrates components of a millimeter-wave transmitter configured for generating a channel-estimation sequence spread by at least one Golay code. The transmitter comprises a Golay-code generator 901, a Marker-code generator 908, and an insertion element 909, which may be implemented within the preamble and marker insertion block 910 shown in FIG. 7. The Golay-code generator 901 is configured for producing at least one Golay code, and the marker-code generator 908 generates at least one marker code comprising at least one Golay code and at least one of a cyclic prefix and a postfix. The code-insertion element 909 is configured for periodically inserting the marker codes between data slots in a sequence of data slots to enable a receiver to perform at least one of a set of functions, comprising tracking, timing acquisition, frequency acquisition, and channel estimation. In one embodiment, the marker-code generator 908 is configured to adapt the length of the marker codes in response to measured or estimated delay spread of the multipath channel. Although the Golay-code generator 901, the marker-code generator 908, and the insertion element 909 are described with respect to generating and periodically inserting at least one marker code, one or more of these components may additionally be configured for processing other fields in a frame.

FIG. 9F illustrates a functional block diagram of a millimeter-wave transmitter in accordance with an embodiment of the invention. Golay codes are generated 911 and used to generate 918 marker codes. The marker codes are then periodically inserted 919 into a frame. In some embodiments, a single apparatus may be employed for performing two or more of the steps 911, 918, and 919.

Figure 9G:
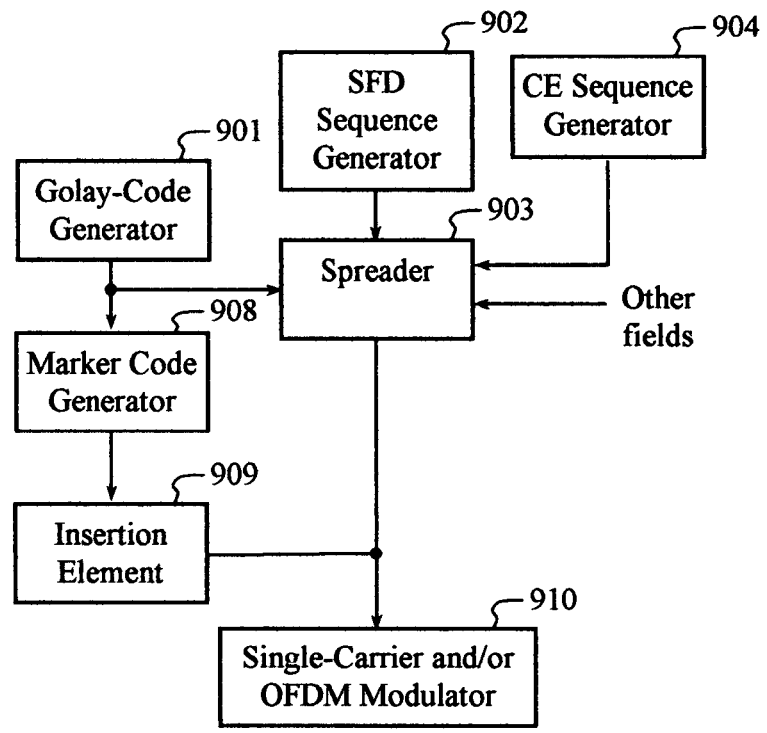
FIG. 9G illustrates a transmitter in accordance with an embodiment of the invention in which a Golay-code generator and a spreader are employed for spreading a plurality of fields in a frame.

FIG. 9G illustrates a transmitter in accordance with an embodiment of the invention in which a Golay-code generator 901 and a spreader 903 are employed for spreading a plurality of fields in a frame. Golay codes generated by the Golay-code generator 901 may be employed for marker-code generation, inserted into one or more fields, and/or used to spread symbols for one or more fields. The spreader 903 comprises at least one input coupled to the Golay-code generator 901, and the spreader 903 is provided with one or more data inputs, such as an SFD sequence from an SFD sequence generator 902, a CE sequence from a CE sequence generator 904, and, optionally, sequences corresponding to one or more alternative fields. Spread sequences and marker codes are coupled to a modulator 910, which may comprise either or both a single-carrier modulator and a multicarrier (e.g., OFDM) modulator.

Figure 9H:
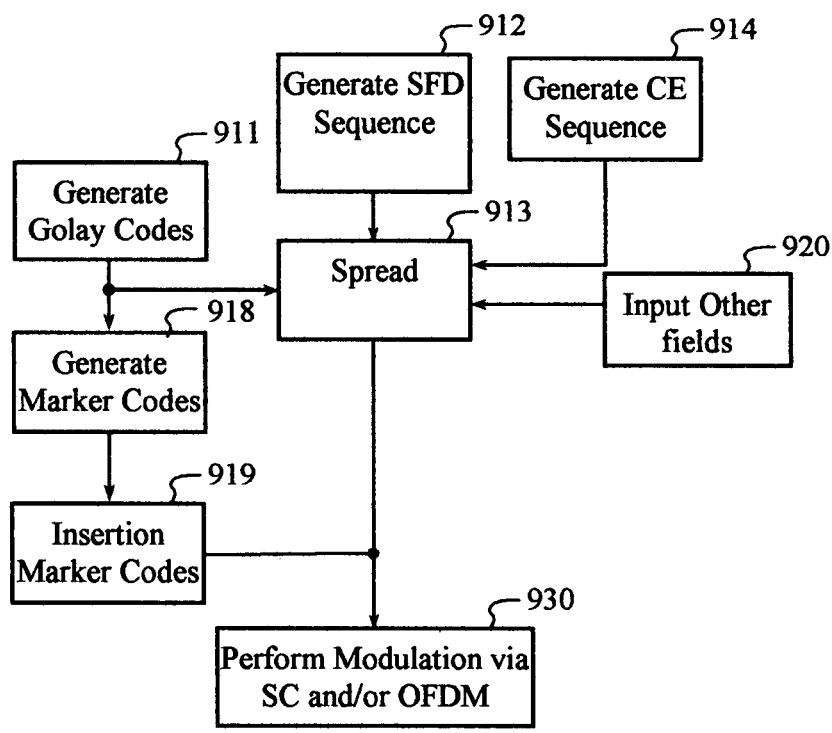
FIG. 9H is a block diagram of a transmission method in accordance with an embodiment of the invention.

FIG. 9H is a block diagram of a transmission method in accordance with an embodiment of the invention. Golay-code generation 911 is provided for a plurality of fields in a frame. For example, the Golay codes may be used to generate marker codes 918 and spread 913 one or more fields in a frame. In one embodiment, the Golay codes are used to spread 913 an SFD sequence, a CE sequence, and at least one additional field. The marker codes 918 may be inserted 919 into the spread sequences prior to modulation 930, which may include single-carrier modulation and/or multicarrier (e.g., OFDM) modulation.

Figure 10A:
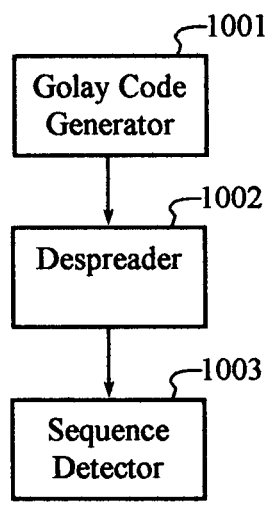
FIG. 10A illustrates a receiver embodiment of the invention configured for detecting at least one sequence spread by a Golay code and determining from the sequence which of a plurality of transmission modes is employed.

FIG. 10A illustrates a receiver embodiment of the invention configured for detecting at least one sequence spread by a Golay code and determining from the sequence which of a plurality of transmission modes is employed. A Golay code generator 1001 generates at least one Golay code used by a despreader 1002 employed for despreading at least one of a plurality of fields comprising a sequence used to denote a particular operating mode of the transmitter. For example, the despreader 1002 may be configured for despreading at least one of a SYNC field and an SFD field in a received signal to produce a despread sequence. A sequence detector 1003 is configured to process the despread sequence for determining which of a plurality of sequences was transmitted, and thus, which of a plurality of transmission modes was employed in the transmitted signal. The sequence detector may be further configured to send a control signal to a demodulator in response to determining which of a plurality of transmission modes the despread sequence denotes. For example, the control signal may be used to configure the demodulator to perform at least one of single-carrier demodulation and OFDM demodulation.

Figure 10B:
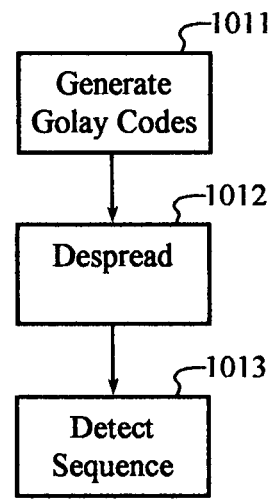
FIG. 10B is a block diagram illustrating a method of receiving a millimeter-wave signal in accordance with an embodiment of the invention.

FIG. 10B is a block diagram illustrating a reception method in accordance with an embodiment of the invention. Golay codes are generated 1011 and used to despread 1012 a received signal comprising at least one transmitted sequence denoting one of a plurality of transmission modes. The resulting despread sequence is detected 1013 to determine which of a plurality of transmission modes was employed in the transmitted signal. Sequence detection may further comprise demodulation control (not shown) to configure demodulation of the received signal.

Figure 10C:
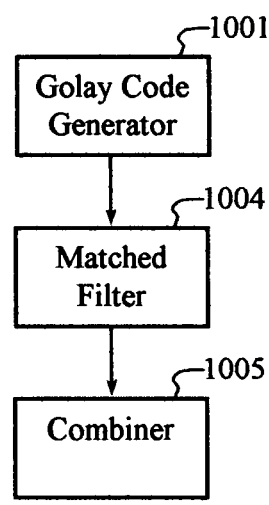
FIG. 10C is a diagram of a receiver in accordance with an embodiment of the invention configured for processing a received signal comprising a channel-estimation sequence spread by at least one Golay code.

FIG. 10C is a diagram of a receiver in accordance with an embodiment of the invention configured for processing a received signal comprising a channel-estimation sequence spread by at least one Golay code. A Golay code generator 1001 generates one or more Golay codes used by a matched filter 1004 for processing a CE data field in a received signal. The CE field may comprise a repetition of code a256 and/or b256, each having a variable or adaptable length cyclic prefix and postfix. Outputs from the matched filter 1004 are combined in a combiner 1005. If complementary codes a256 and b256 are employed in the CE field, the combined matched filter 1004 outputs of a256 and b256 can produce a Dirac pulse (i.e., a pulse having no sidelobes), which allows for a perfect estimate of the multipath channel to be made. At least one component of the receiver, such as the matched filter 1004, may further comprise a sequence-truncation module configured for removing at least one of a cyclic prefix and a postfix from the received signal.

Figure 10D:
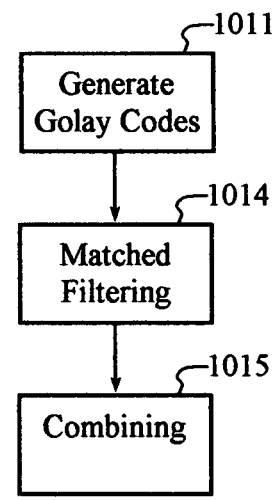
FIG. 10D is a flow diagram illustrating a method in accordance with another embodiment of the invention.

FIG. 10D is a flow diagram illustrating a method in accordance with another embodiment of the invention. Golay codes are generated 1011, followed by matched filtering 1014 of a CE field in a received signal, which results in a plurality of matched-filter outputs. The matched-filter outputs are combined 1015 to produce an estimate of the multipath channel. In one embodiment, at least one of a cyclic prefix and a postfix may be removed from the CE field prior to matched filtering 1014.

Figure 10E:
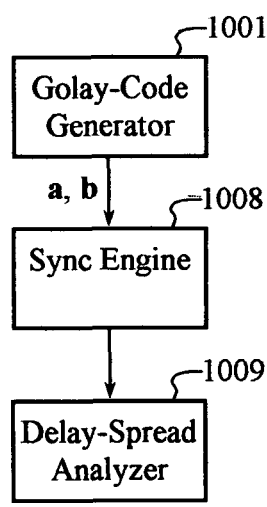
FIG. 10E illustrates a receiver embodiment of the invention.

FIG. 10E illustrates a receiver embodiment of the invention comprising a Golay code generator 1001, a synchronization engine 1008, and a delay-spread analyzer 1009. The Golay code generator 1001 is configured to produce at least one Golay code corresponding to at least one of a plurality of marker codes periodically inserted between data slots in a received transmission. Each marker code comprises at least one Golay code, and at least one of a cyclic prefix and a postfix. The marker codes may be configured to allow the same synchronization engine to be employed for both single carrier and OFDM modes. The synchronization engine 1008 employs the at least one Golay code to process the plurality of marker codes for performing at least one of a set of functions, including (but not limited to) tracking, timing acquisition, frequency acquisition, and channel estimation. The synchronization engine 1008 may be further configured for removing at least one of a cyclic prefix and a postfix from each of the marker codes.

An optional delay-spread analyzer 1009 provides for measuring the delay spread at the receiver and reporting it back to the transmitter such that the length of the marker codes may be adapted. For example, the length of the marker codes may be adjusted from a short length, which may be as small as zero for LOS (Line Of Sight) applications, to a long length covering worst case delay spread for multipath-rich environments.

Figure 10F:
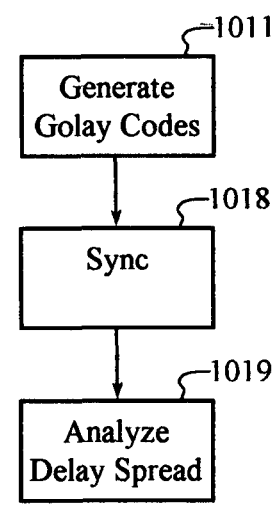
FIG. 10F illustrates a reception method configured to process marker codes in a received transmission.

FIG. 10F illustrates a reception method configured to process marker codes in a received transmission for performing tracking, timing acquisition, frequency acquisition, and/or channel estimation. Complementary Golay codes are generated 1011 and processed with a received signal comprising periodic marker codes in a synchronizing step 1018. The delay spread of the received signal may be analyzed 1019 and sent back to the transmitter, which may adapt the length of the marker codes.

In various receiver embodiments of the invention, receiver components, including (but not limited to) the Golay code generator 1001, may be employed for processing a plurality of fields in a frame of a received signal. A single Golay code generator (such as the Golay code generator 1001) may be employed for performing despreading, matched filtering, and synchronizing a received signal. Similarly, other receiver components may be used for a plurality of reception functions. Furthermore, one or more components shown and described in the receiver and transmitter embodiments may be employed for generating a transmit signal and processing a received signal.

Figure 11A:
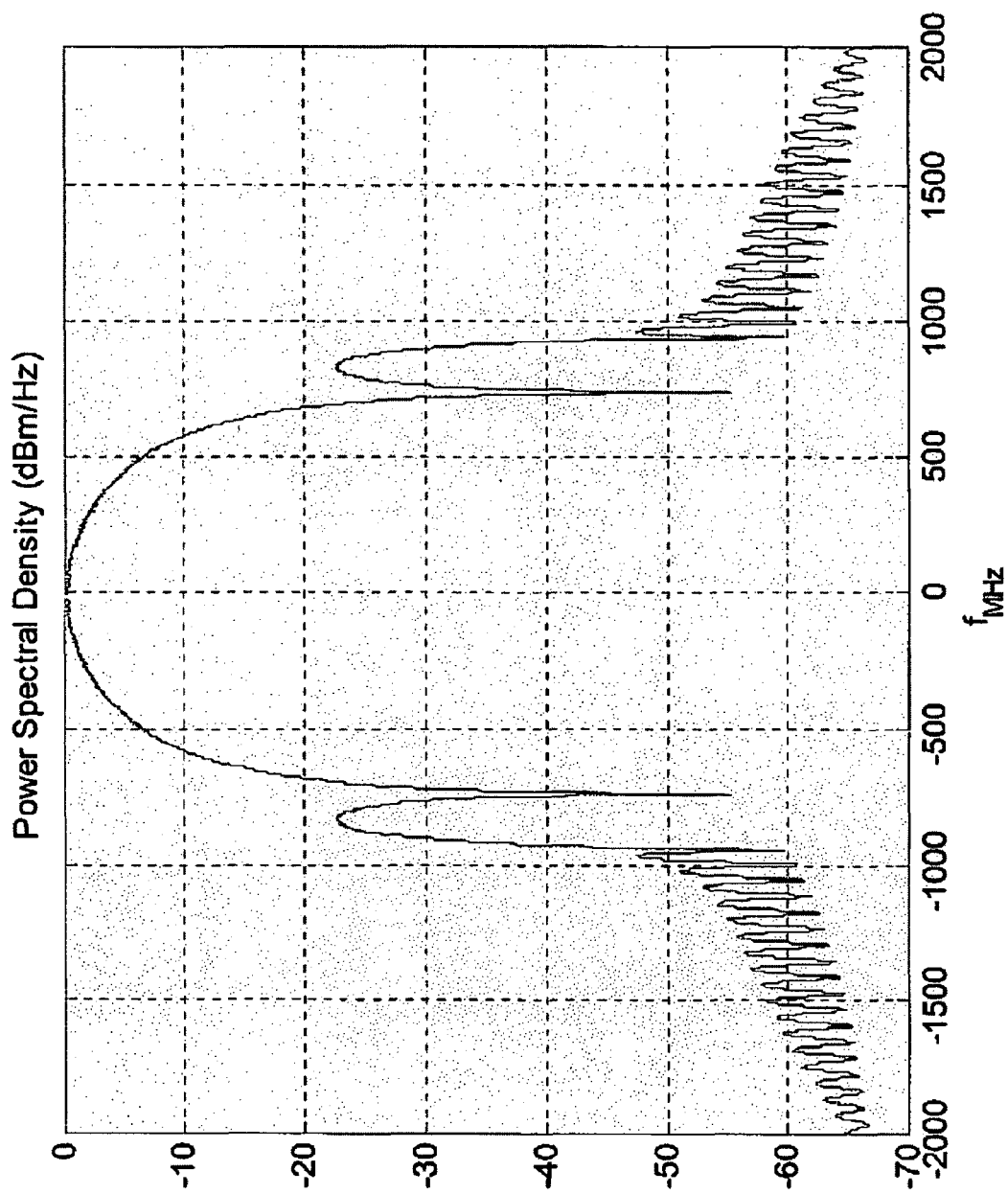
FIG. 11A shows the spectrum of a UWB system in which a transmission is spread with a BPSK code [1 1].
Figure 11B:
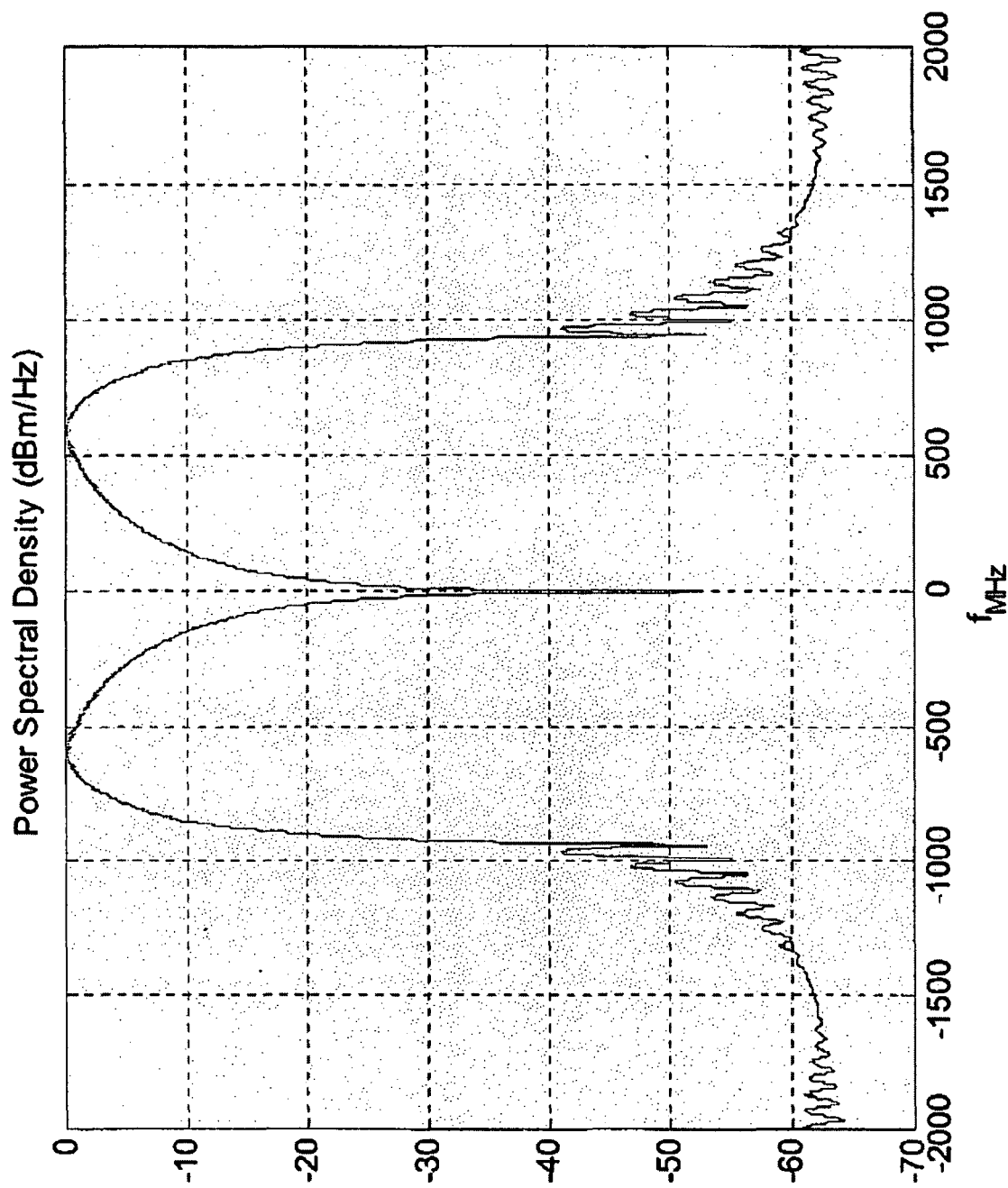
FIG. 11B shows the spectrum of a UWB signal spread with the complementary BPSK code [1 −1].
Figure 11C:
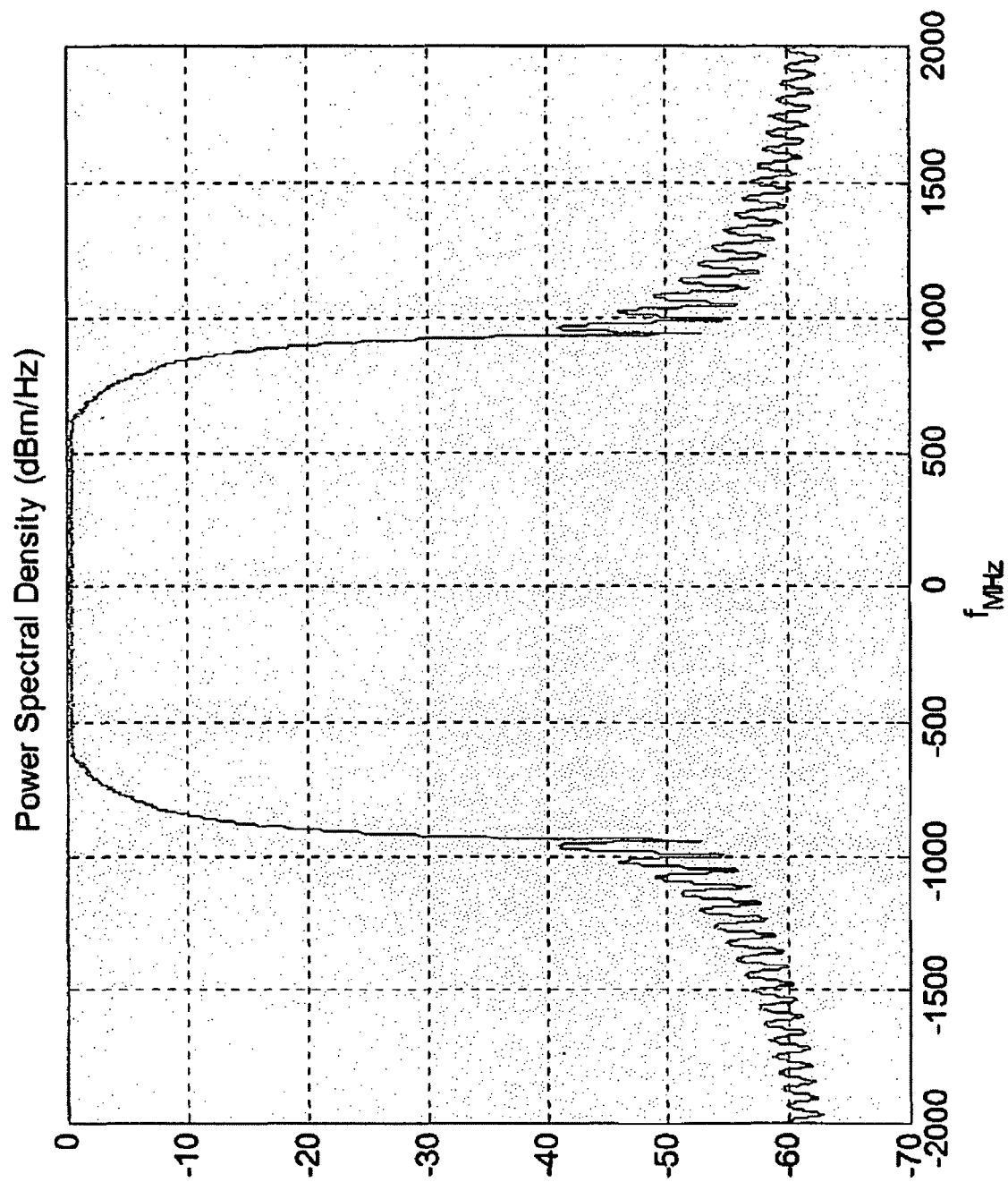
FIG. 11C shows the spectrum of a UWB signal when alternating spreading codes [1 1] and [−1 1] are used.

Partitioning a symbol frame into a plurality of blocks and spreading the blocks with complementary codes a or b flattens the spectrum, thus reducing amplifier back-off. This is because the sum of the autocorrelation of complementary codes a or b has zero sidelobe levels. FIG. 11A shows the spectrum of a millimeter-wave UWB system in which a transmission is spread with a BPSK code [1 1]. The resulting spectrum is not flat, and requires the transmitter to employ a back-off of 3.3 dB to meet FCC requirements. FIG. 11B shows the spectrum of a millimeter-wave signal spread with the complementary BPSK code [1 −1]. FIG. 11C shows the resulting flat spectrum when alternating spreading codes [1 1] and [−1 1] are used.

FIG. 12A shows a set of self-synchronized scramblers for use in at least one piconet for whitening the spectrum and reducing the peak-to-average power of the transmitted waveform. The set of self-synchronized scramblers comprises a first scrambling-code generator configured for generating a first scrambling code expressed by $(1)^{fix(n/m)}$, a second scrambling-code generator configured for generating a second scrambling code expressed by $(-1)^{fix(n/m)}$, a third scrambling-code generator configured for generating a third scrambling code expressed by $(i)^{fix(n/m)}$, and a fourth scrambling-code generator configured for generating a fourth scrambling code expressed by $(-i)^{fix(n/m)}$, wherein n is an integer sequence, m is a periodicity factor, and fix( ) returns the integer portion of n/m. If different piconets use different scramblers from the set, interference-rejection is improved and the same spreading codes can be used by all piconets. FIG. 12B illustrates a corresponding set of descramblers.

One embodiment of the invention comprises a signaling mode that supports use of both open-loop and close-loop control. An open-loop receiver architecture allows for low-speed tracking of timing signals, frequency, and channel impulse response, thus providing for low power, low complexity, and a small processor chip size. A closed-loop receiver architecture can improve receiver performance, but typically results in higher power consumption and cost.

FIG. 13A illustrates a method for providing a millimeter-wave frame format that allows both open-loop and close-loop control to be used. The method comprises fragmenting 1301 a data frame into a plurality of blocks, generating 1302 a Golay code pair, and inserting 1303 the at least one Golay code in each of the plurality of blocks for producing a plurality of inserted Golay codes.

In one embodiment, the plurality of blocks comprises even-numbered blocks and odd-numbered blocks, and the Golay code pair comprises a first Golay complementary code and a second Golay complementary code. The first Golay complementary code is inserted behind each even-numbered block and the second Golay complementary code is inserted behind each odd-numbered block. In one embodiment, mother or daughter Golay codes $a_{64}$ and $b_{64}$ may be used.

In an alternative embodiment of the invention, the first Golay complementary code is inserted inside each even-numbered block and the second Golay complementary code is inserted inside each odd-numbered block. Thus, apparatus embodiments shown herein may comprise a Golay-code generator configured to generate inserted Golay codes comprising Golay codes inserted between the blocks and/or inside the blocks. Codes inserted between blocks may be positioned to precede or follow particular blocks. The Golay codes may be provided with a cyclic prefix and/or a cyclic postfix.

Embodiments of the invention may provide for dithering the inserted Golay codes, such as by cyclically shifting the codes or by zero insertion. Such techniques may be performed for the purpose of flattening the spectrum, reducing peak-to-average power, and/or providing for improved interference rejection. However, the scope of the invention is not defined by particular benefits that may be achieved.

A receiver may be configured for processing a received transmission signal generated according to the method shown in FIG. 13A. The received signal comprises a data frame fragmented into a plurality of blocks, wherein each block comprises one of a plurality of inserted Golay codes. A reception method shown in FIG. 13B comprises providing for matched-filtering 1304 each of the plurality of inserted Golay codes for producing a matched-filtered output, and accumulating 1305 the matched-filtered output for use as a channel impulse response. FIG. 13C illustrates a frame format in accordance with one embodiment of the invention.

Figure 14:
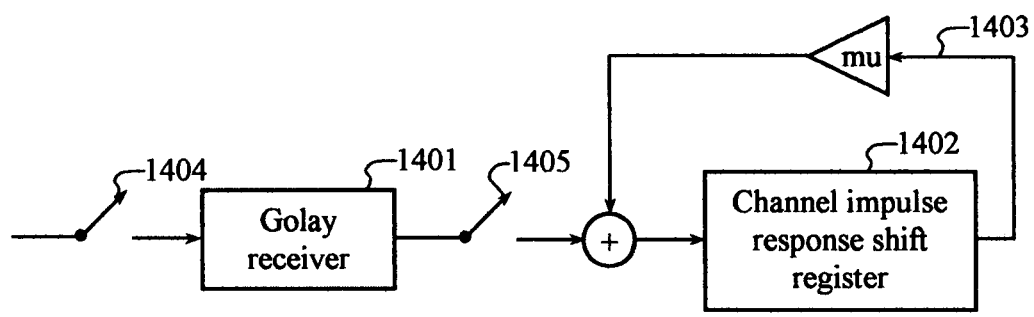
FIG. 14 is a block diagram of a circuit configured for performing channel tracking.

FIG. 14 is a block diagram of a circuit configured for performing channel tracking comprising a Golay receiver 1401 and a shift register 1402 with a feedback loop 1403. The circuit is configured for processing a received transmission comprising a data frame fragmented into a plurality of blocks, wherein each block is followed by one of a plurality of known Golay codes. The Golay receiver 1401 is configured for matched-filtering each of the plurality of known Golay codes for producing a matched-filtered output, and the shift register 1402 accumulates the matched-filtered output for use as a channel impulse response. Switches 1404 and 1405 are closed upon reception of the known Golay codes between the blocks.

Figure 15:
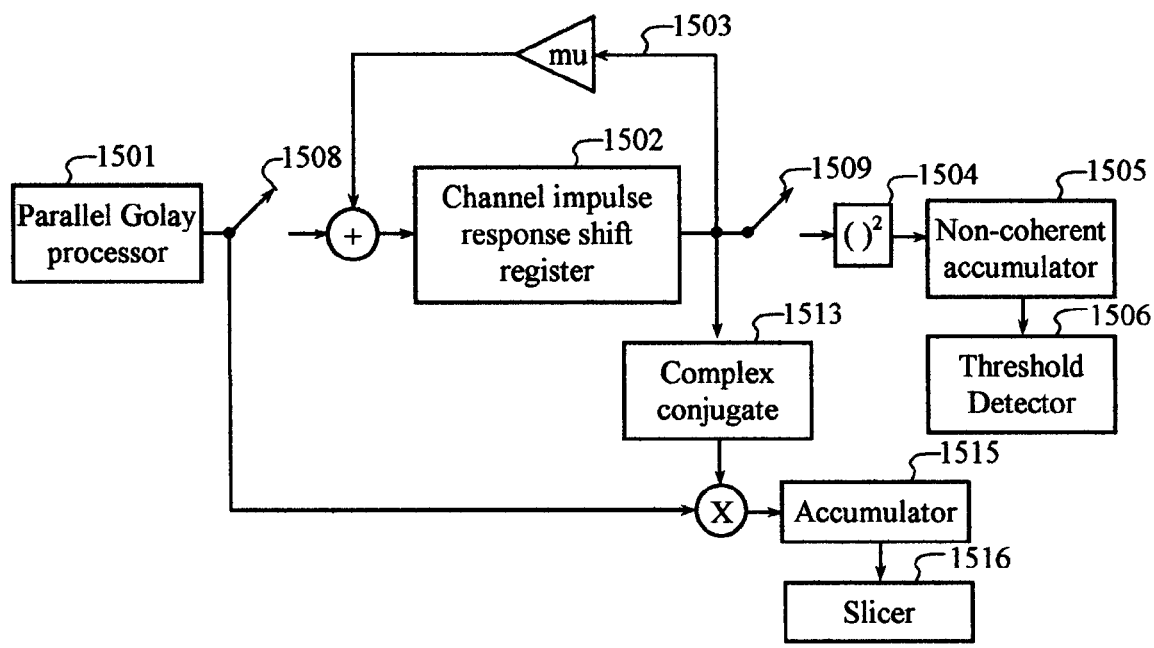
FIG. 15 is a block diagram of a packet detector.

FIG. 15 is a block diagram of a packet detector, comprising a parallel Golay processor 1501, a channel impulse response shift register 1502 with a feedback loop 1503, a squarer 1504, a non-coherent accumulator 1505, and a threshold detector 1506. The parallel Golay processor 1501, which may have the form of the matched-filter circuit shown in FIG. 5, despreads a received signal for producing a despread signal. The channel impulse response shift register 1502 is configured for accumulating the despread signal for use as a channel impulse response. A switch 1509 samples the output of the channel impulse response shift register 1502 for a predetermined number of codes for producing a sampled signal. The squarer 1504 processes the sampled signal to calculate signal power. The non-coherent accumulator 1505 non-coherently accumulates the despread-signal power for producing an accumulated output signal, and the threshold detector 1506 compares the accumulated output signal to a predetermined threshold for determining the presence or absence of a piconet signal. The output of the Parallel Golay Processor is despread by the channel impulse response via multiplication and accumulation 1515. The accumulator 1515 output is fed to a slicer 1516 that estimates the data. In one embodiment, the circuit shown in FIG. 15 implements preamble detection, channel impulse response acquisition, data despreading, and data estimation.

In a multi-mode system, both a single-carrier receiver and an OFDM receiver would typically employ a Golay-code receiver to detect the preamble of a received signal. In some embodiments, the same Golay receiver may be used to decode the header and data frame as well. In another embodiment, different cyclic shifts of the same Golay code may be used to encode a number of data bits in at least one of the header and the data fields in a frame. For example, if a Golay code pair of length 256 is used for the preamble, then header and data fields may employ 4 cyclic shifts along with the sign to carry 3 bits of information as follows:

000=>b0 b1 . . . b255
100=>−b0 −b1 . . . −b255
001=>b64 . . . b255 b0 . . . b63
101=>−b64 . . . −b255 −b0 . . . −b63
010=>b128 . . . b255 −b0 . . . b127
110=>−b128 . . . −b255 −b0 . . . −b127
011=>b192 . . . b255 b0 . . . b191
111=>−b192 . . . −b255 −b0 . . . −b191

A single Golay receiver may be employed for a common mode. Since the Golay receiver implements a matched filter relative to the Golay code, it produces a peak at the appropriate cyclic shift. Maximum Ratio combining may be employed at the corresponding cyclic shifts, and the resulting four values may be used to decode the right two bits. The left bit may be determined from the sign of the maximum peak.

Some embodiments for the invention may employ a single processor as the Golay receiver and as an FFT/IFFT processor. Thus, the single processor may be used for packet detection and data demodulation in both single carrier and OFDM systems. In one embodiment, a single device may support both single carrier and OFDM signaling.

The scope of the invention should not be interpreted as being limited to the type of ordering illustrated in the embodiments. Rather, the Applicants anticipate that alternative code-set orderings may be implemented, and that such orderings fall within the scope and spirit of the invention.

It should be appreciated that the apparatus and method embodiments of the invention may be implemented using a variety of hardware and software. For example, a Golay-code generator may be implemented using special-purpose hardware, such as an application specific integrated circuit (ASIC) and programmable logic devices such as gate arrays, and/or software or firmware running on a computing device, such as a microprocessor, microcontroller or digital signal processor (DSP). It also will be appreciated that although functions of the Golay-code generator may be integrated in a single device, such as a single ASIC, they may also be distributed among several devices.

The invention is not intended to be limited to the preferred embodiments. Furthermore, those skilled in the art should recognize that the method and apparatus embodiments described herein may be implemented in a variety of ways, including implementations in hardware, software, firmware, or various combinations thereof. Examples of such hardware may include ASICs, Field Programmable Gate Arrays, general-purpose processors, DSPs, and/or other circuitry. Software and/or firmware implementations of the invention may be implemented via any combination of programming languages, including Java, C, C++, Matlab™, Verilog, VHDL, and/or processor specific machine and assembly languages.

Computer programs (i.e., software and/or firmware) implementing the method of this invention may be distributed to users on a distribution medium, such as a SIM card, a USB memory interface, or other computer-readable memory adapted for interfacing with a wireless terminal. Similarly, computer programs may be distributed to users via wired or wireless network interfaces. From there, they will often be copied to a hard disk or a similar intermediate storage medium. When the programs are to be run, they may be loaded either from their distribution medium or their intermediate storage medium into the execution memory of a wireless terminal, configuring an onboard digital computer system (e.g. a microprocessor) to act in accordance with the method of this invention. All these operations are well known to those skilled in the art of computer systems.

The term "computer-readable medium" encompasses distribution media, intermediate storage media, execution memory of a computer, and any other medium or device capable of storing for later reading by a digital computer system a computer program implementing the method of this invention.

Various digital computer system configurations can be employed to perform the method embodiments of this invention, and to the extent that a particular system configuration is capable of performing the method embodiments of this invention, it is equivalent to the representative system embodiments of the invention disclosed herein, and within the scope and spirit of this invention.

Once digital computer systems are programmed to perform particular functions pursuant to instructions from program software that implements the method embodiments of this invention, such digital computer systems in effect become special-purpose computers particular to the method embodiments of this invention. The techniques necessary for this programming are well known to those skilled in the art of computer systems.

Various embodiments of the invention may include variations in system configurations and the order of steps in which methods are provided. In many cases, multiple steps and/or multiple components may be consolidated.

The method and system embodiments described herein merely illustrate particular embodiments of the invention. It should be appreciated that those skilled in the art will be able to devise various arrangements, which, although not explicitly described or shown herein, embody the principles of the invention and are included within its spirit and scope. Furthermore, all examples and conditional language recited herein are intended to be only for pedagogical purposes to aid the reader in understanding the principles of the invention. This disclosure and its associated references are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

It should be appreciated by those skilled in the art that the block diagrams herein represent conceptual views of illustrative circuitry, algorithms, and functional steps embodying principles of the invention. Similarly, it should be appreciated that any flow charts, flow diagrams, signal diagrams, system diagrams, codes, and the like represent various processes that may be substantially represented in computer-readable medium and so executed by a computer or processor, whether or not such computer or processor is explicitly shown.

The functions of the various elements shown in the drawings, including functional blocks labeled as "processors" or "systems," may be provided through the use of dedicated hardware as well as hardware capable of executing software in association with appropriate software. When provided by a processor, the functions may be provided by a single dedicated processor, by a shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, read-only memory (ROM) for storing software, random access memory (RAM), and non-volatile storage. Other hardware, conventional and/or custom, may also be included. Similarly, the function of any component or device described herein may be carried out through the operation of program logic, through dedicated logic, through the interaction of program control and dedicated logic, or even manually, the particular technique being selectable by the implementer as more specifically understood from the context.

Any element expressed herein as a means for performing a specified function is intended to encompass any way of performing that function including, for example, a combination of circuit elements which performs that function, or software in any form, including, therefore, firmware, micro-code or the like, combined with appropriate circuitry for executing that software to perform the function. Embodiments of the invention as described herein reside in the fact that the functionalities provided by the various recited means are combined and brought together in the manner which the operational descriptions call for. Applicant regards any means that can provide those functionalities as equivalent to those shown herein.

The invention claimed is:

1. A millimeter wave apparatus, comprising:
    a Golay code generator configured to produce at least one Golay code,
    a sequence generator configured for generating at least one of a plurality of sequences, each of the plurality of sequences denoting one of a plurality of transmission modes, and
    a spreader configured for spreading at least one of the plurality of sequences with the at least one Golay code for producing at least one spread sequence, and selecting the at least one spread sequence in response to at least one transmission mode to generate at least one of a SYNC field and an SFD field.

2. The apparatus recited in claim 1, wherein the plurality of transmission modes comprise at least two of a set, the set comprising a single-carrier mode, an OFDM mode, and a dual mode.

3. The apparatus recited in claim 1, wherein the plurality of transmission modes comprise at least two different single-carrier transmission modes.

4. A method for generating a millimeter wave signal, comprising:
    generating at least one Golay code,
    generating a plurality of sequences, each of the plurality of sequences denoting one of a plurality of transmission modes, and
    spreading at least one of the plurality of sequences with the at least one Golay code for producing at least one spread sequence, and selecting the at least one spread sequence in response to at least one transmission mode to generate at least one of a SYNC field and an SFD field of the millimeter wave signal.

5. The method recited in claim 4, wherein the plurality of transmission modes comprise at least two of a set, the set comprising a single-carrier mode, an OFDM mode, and a dual mode.

6. A digital computer system programmed to perform the method recited in claim 4.

7. A computer-readable storage medium encoded with instructions executable to:
    generate at least one Golay code,
    generate a plurality of sequences, each of the plurality of sequences denoting one of a plurality of transmission modes, and
    spread at least one of the plurality of sequences with the at least one Golay code for producing at least one spread sequence, and selecting the at least one spread sequence in response to at least one transmission mode to generate at least one of a SYNC field and an SFD field of the millimeter wave signal.

8. The method recited in claim 4, wherein the plurality of transmission modes comprise at least two different single-carrier transmission modes.

9. A millimeter wave transmission system, comprising:
    a Golay code generation means configured to generate at least one Golay code,
    a sequence generation means configured for generating at least one of a plurality of sequences, each of the plurality of sequences denoting one of a plurality of transmission modes, and
    a spreading means configured for spreading at least one of the plurality of sequences with the at least one Golay code for producing at least one spread sequence, and selecting the at least one spread sequence in response to at least one transmission mode to generate at least one of a SYNC field and an SFD field.

10. The system recited in claim 9, wherein the plurality of transmission modes comprise at least two of a set, the set comprising a single-carrier mode, an OFDM mode, and a dual mode.

11. The system recited in claim 9, wherein the plurality of transmission modes comprise at least two different single-carrier transmission modes.

12. A millimeter wave apparatus comprising:
    a Golay code generator configured to produce at least one Golay code, and
    a despreader configured for employing the at least one Golay code for despreading at least one of a SYNC field and an SFD field in a received signal to produce a despread sequence, the despreader further comprising a sequence detector configured for determining which of a plurality of transmission modes the despread sequence denotes.

13. The apparatus recited in claim 12, further comprising a demodulator, and the sequence detector further configured to send a control signal to the demodulator in response to determining which of a plurality of transmission modes the despread sequence denotes.

14. The apparatus recited in claim 12, wherein the plurality of transmission modes comprise at least two of a single-carrier mode, a multicarrier mode, and a dual mode.

15. The apparatus recited in claim 12, further configured to process the received signal in accordance with which of the plurality of transmission modes the despread sequence denotes.

16. A method for receiving a millimeter wave signal, comprising:
   generating at least one Golay code,
   employing the at least one Golay code for despreading at least one of a SYNC field and an SFD field in a received signal to produce a despread sequence, and determining which of a plurality of transmission modes the despread sequence denotes.

17. The method recited in claim 16, further comprising demodulating the received signal in response to determining which of the plurality of transmission modes the despread sequence denotes.

18. The method recited in claim 16, wherein the plurality of transmission modes comprise at least two of a single-carrier mode, a multicarrier mode, and a dual mode.

19. The method recited in claim 16, further configured to process the received signal in accordance with which of the plurality of transmission modes the despread sequence denotes.

20. A digital computer system programmed to perform the method recited in claim 16.

21. A computer-readable storage medium encoded with instructions executable to:
   generate at least one Golay code,
   employ the at least one Golay code for despreading at least one of a SYNC field and an SFD field in a received signal to produce a despread sequence, and
   determine which of a plurality of transmission modes the despread sequence denotes.

22. A millimeter wave receiver system, comprising:
   a Golay code generation means configured to produce at least one Golay code,
   a despreading means configured for employing the at least one Golay code for despreading at least one of a SYNC field and an SFD field in a received signal to produce a despread sequence, and
   a sequence-detection means configured for determining which of a plurality of transmission modes the despread sequence denotes.

23. The receiver system recited in claim 22, further comprising a demodulation means configured for demodulating the received signal, the sequence-detection means further configured to send a control signal to the demodulation means in response to determining which of a plurality of transmission modes the despread sequence denotes.

24. The receiver system recited in claim 22, wherein the plurality of transmission modes comprise at least two of a single-carrier mode, a multicarrier mode, and a dual mode.

25. The receiver system recited in claim 22, further configured to process the received signal in accordance with which of the plurality of transmission modes the despread sequence denotes.

26. A millimeter wave apparatus, comprising:
   a Golay code generator configured to produce a pair of complementary Golay codes, and
   a sequence generator configured for generating a channel-estimation sequence, and
   a spreader configured for spreading the channel-estimation sequence with the pair of complementary Golay codes for producing at least one spread sequence configured for producing at least one Dirac pulse when combining matched-filter outputs at a receiver.

27. The apparatus recited in claim 26, wherein the spreader is configured for adding at least one of a cyclic prefix and a postfix to the at least one spread sequence.

28. A method for generating a millimeter wave signal, comprising:
   generating a pair of complementary Golay codes, and
   generating a channel-estimation sequence, and
   spreading the channel-estimation sequence with the pair of complementary Golay codes for producing at least one spread sequence configured for producing at least one Dirac pulse when combining matched-filter outputs at a receiver, wherein the millimeter wave signal to be transmitted to the receiver comprises the at least one spread sequence.

29. The method recited in claim 28, wherein spreading further comprises adding at least one of a cyclic prefix and a postfix to the at least one spread sequence.

30. A digital computer system programmed to perform the method recited in claim 28.

31. A computer-readable storage medium encoded with instructions executable to:
   generate a pair of complementary Golay codes, and
   generate a channel-estimation sequence, and
   spread the channel-estimation sequence with the pair of complementary Golay codes for producing at least one spread sequence configured for producing at least one Dirac pulse when combining matched-filter outputs at a receiver, wherein the millimeter wave signal to be transmitted to the receiver comprises the at least one spread sequence.

32. A millimeter wave transmission system, comprising:
   a Golay code generation means configured for generating a pair of complementary Golay codes, and
   a sequence generation means configured for generating a channel-estimation sequence, and
   a spreading means configured for spreading the channel-estimation sequence with the pair of complementary Golay codes for producing at least one spread sequence configured for producing at least one Dirac pulse when combining matched-filter outputs at a receiver.

33. The transmission system recited in claim 32, wherein the spreading means is configured for adding at least one of a cyclic prefix and a postfix to the at least one spread sequence.

34. A millimeter wave apparatus, comprising:
   a Golay code generator configured to produce a pair of complementary Golay codes, and
   a matched filter configured to employ the complementary Golay codes for matched filtering a received signal comprising at least one channel-estimation sequence spread with the pair of complementary Golay codes, the matched filter further comprising a combiner configured for combining matched-filter outputs to produce at least one Dirac pulse.

35. The apparatus recited in claim 34, further configured for removing at least one of a cyclic prefix and a postfix from the received signal.

36. A method for receiving a millimeter wave signal, comprising:
   generating a pair of complementary Golay codes, and
   employing the complementary Golay codes for matched filtering a received signal to produce a plurality of matched-filter outputs, the received signal comprising at least one channel-estimation sequence spread with the pair of complementary Golay codes, and
   combining matched-filter outputs to produce at least one Dirac pulse.

37. The method recited in claim 36, further configured for removing at least one of a cyclic prefix and a postfix from the received signal.

38. A digital computer system programmed to perform the method recited in claim 36.

39. A computer-readable storage medium encoded with instructions executable to:
generate a pair of complementary Golay codes, and
employ the complementary Golay codes for matched filtering a received signal to produce a plurality of matched-filter outputs, the received signal comprising at least one channel-estimation sequence spread with the pair of complementary Golay codes, and
combine matched-filter outputs to produce at least one Dirac pulse.

40. A millimeter wave receiver system, comprising:
a Golay code generation means configured to produce a pair of complementary Golay codes,
a matched filtering means configured to employ the complementary Golay codes for matched filtering a received signal comprising at least one channel-estimation sequence spread with the pair of complementary Golay codes, and
a combining means configured for combining outputs of the matched-filtering means to produce at least one Dirac pulse.

41. The system recited in claim 40, further configured for removing at least one of a cyclic prefix and a postfix from the received signal.

42. A millimeter wave apparatus, comprising:
a Golay code generator configured to produce at least one Golay code, wherein the at least one Golay code produced by the Golay code generator comprises a complementary Golay code pair,
a marker-code generator configured for producing a plurality of marker codes from the at least one Golay code, and
a code-insertion element configured for periodically inserting the marker codes between data slots in a sequence of data slots to enable a receiver to perform at least one of a set of functions, comprising tracking, timing acquisition, frequency acquisition, and channel estimation.

43. The apparatus recited in claim 42, wherein the marker-code generator is configured for adapting the code length of the plurality of marker codes.

44. The apparatus recited in claim 42, wherein the marker-code generator is configured for inserting at least one of a cyclic prefix and a postfix to each of the plurality of marker codes.

45. The apparatus recited in claim 42, wherein at least one of the marker-code generator and the code-insertion element is configured to adapt the marker codes for producing a spectrum corresponding to regularly spaced pilot tones in an OFDM signal.

46. A method for generating a millimeter wave signal, comprising:
generating at least one Golay code, wherein the at least one Golay code comprises a complementary Golay code pair,
generating a plurality of marker codes from the at least one Golay code, and
periodically inserting the marker codes between data slots in a sequence of data slots to enable a receiver to perform at least one of a set of functions, comprising tracking, timing acquisition, frequency acquisition, and channel estimation, wherein the millimeter wave signal to be transmitted to the receiver comprises the sequence of data slots with the inserted marker codes.

47. The method recited in claim 46, wherein generating the plurality of marker codes comprises adapting the code length of the plurality of marker codes.

48. The method recited in claim 46, wherein generating a plurality of marker codes further comprises inserting at least one of a cyclic prefix and a postfix to each of the plurality of marker codes.

49. The method recited in claim 46, wherein at least one of generating a plurality of marker codes and periodically inserting the marker codes is configured to adapt the marker codes for producing a spectrum corresponding to regularly spaced pilot tones in an OFDM signal.

50. A digital computer system programmed to perform the method recited in claim 46.

51. A computer-readable storage medium encoded with instructions executable to:
generate at least one Golay code, wherein the at least one Golay code comprises a complementary Golay code pair,
generate a plurality of marker codes from the at least one Golay code, and
periodically insert the marker codes between data slots in a sequence of data slots to enable a receiver to perform at least one of a set of functions, comprising tracking, timing acquisition, frequency acquisition, and channel estimation, wherein the millimeter wave signal to be transmitted to the receiver comprises the sequence of data slots with the inserted marker codes.

52. A millimeter wave transmission system, comprising:
a Golay code generation means configured to produce at least one Golay code, wherein the at least one Golay code produced by the Golay code generation means comprises a complementary Golay code pair,
a marker-code generation means configured for producing a plurality of marker codes from the at least one Golay codes, and
a code-insertion means configured for periodically inserting the marker codes between data slots in a sequence of data slots to enable a receiver to perform at least one of a set of functions, comprising tracking, timing acquisition, frequency acquisition, and channel estimation.

53. The system recited in claim 52, wherein the marker-code generation means is configured for adapting the code length of the plurality of marker codes.

54. The system recited in claim 52, wherein the marker-code generation means is configured for inserting at least one of a cyclic prefix and a postfix to each of the plurality of marker codes.

55. The system recited in claim 52, wherein at least one of the marker-code generation means and the code-insertion means is configured to adapt the marker codes for producing a spectrum corresponding to regularly spaced pilot tones in an OFDM signal.

56. A millimeter wave apparatus, comprising:
a Golay code generator configured to produce at least one Golay code corresponding to at least one of a plurality of marker codes periodically inserted between data slots in a received transmission, and
a synchronization engine configured for employing the at least one Golay code to process the plurality of marker codes for performing at least one of a set of functions, comprising tracking, timing acquisition, frequency acquisition, and channel estimation.

57. The apparatus recited in claim 56, wherein the at least one Golay code produced by the Golay code generator comprises a complementary Golay code pair.

58. The apparatus recited in claim 56, wherein the synchronization engine is configured for measuring delay spread of the received transmission and reporting it back to a transmitter for adapting length of the marker codes.

59. The apparatus recited in claim 56, wherein the synchronization engine is configured for removing at least one of a cyclic prefix and a postfix from each of the plurality of marker codes.

60. A method for receiving a millimeter wave signal, comprising:
generating at least one Golay code corresponding to at least one of a plurality of marker codes periodically inserted between data slots in a received transmission, and
employing the at least one Golay code to process the plurality of marker codes for performing at least one of a set of functions, comprising tracking, timing acquisition, frequency acquisition, and channel estimation.

61. The method recited in claim 60, wherein the at least one Golay code comprises a complementary Golay code pair.

62. The method recited in claim 60, wherein employing the at least one Golay code to process the plurality of marker codes is configured for measuring delay spread of the received transmission and reporting it back to a transmitter for adapting length of the marker codes.

63. The method recited in claim 60, wherein employing the at least one Golay code to process the plurality of marker codes is configured for removing at least one of a cyclic prefix and a postfix from each of the plurality of marker codes.

64. A digital computer system programmed to perform the method recited in claim 60.

65. A computer-readable storage medium encoded with instructions executable to:
generate at least one Golay code corresponding to at least one of a plurality of marker codes periodically inserted between data slots in a received transmission, and
employ the at least one Golay code to process the plurality of marker codes for performing at least one of a set of functions, comprising tracking, timing acquisition, frequency acquisition, and channel estimation.

66. A millimeter wave receiver system, comprising:
a Golay code generation means configured to produce at least one Golay code corresponding to at least one of a plurality of marker codes periodically inserted between data slots in a received transmission, and
a synchronization engine means configured for employing the at least one Golay code to process the plurality of marker codes for performing at least one of a set of functions, comprising tracking, timing acquisition, frequency acquisition, and channel estimation.

67. The system recited in claim 66, wherein the at least one Golay code produced by the Golay code generation means comprises a complementary Golay code pair.

68. The system recited in claim 66, wherein the synchronization engine means is configured for measuring delay spread of the received transmission and reporting it back to a transmitter for adapting length of the marker codes.

69. The system recited in claim 66, wherein the synchronization engine means is configured for removing at least one of a cyclic prefix and a postfix from each of the plurality of marker codes.

70. A method for providing a sub-slot transmission sequence with at least one prefix, wherein the sub-slot transmission sequence employs an inverse Fourier transform of length N, the method comprising:
generating a Golay sequence comprising M symbols wherein M<N, wherein M is selected with respect to channel delay in a multipath channel,
allocating a sub-slot length of N-M symbols, and
employing the Golay sequence to produce the at least one prefix, each of the at least one prefix comprising M symbols.

71. The method recited in claim 70, wherein the Golay sequence comprises at least one of a set of complementary Golay codes.

72. The method recited in claim 70, further comprising receiving the sub-slot transmission sequence and processing the at least one prefix for performing at least one of channel tracking, timing-offset tracking, and frequency-offset tracking.

73. The method recited in claim 70, further comprising employing the Golay sequence to produce at least one postfix, each of the at least one postfix comprising M symbols.

74. A digital computer system programmed to perform the method recited in claim 70.

75. A computer-readable storage medium encoded with instructions executable to:
generate a Golay sequence comprising M symbols wherein M<N, wherein M is selected with respect to channel delay in a multipath channel,
allocate a sub-slot length of N-M symbols, and
employ the Golay sequence to produce the at least one prefix, each of the at least one prefix comprising M symbols.

76. An apparatus configured for generating a sub-slot transmission sequence with at least one prefix, wherein the apparatus employs an inverse Fourier transform of length N, the apparatus comprising:
a Golay sequence generator configured for generating a Golay sequence comprising M symbols wherein M<N, wherein the Golay sequence generator is configured to select M with respect to channel delay in a multipath channel,
a sub-slot sequence generator configured for generating a Golay-code modulated data sequence having a sub-slot length of N-M symbols, and
a prefix generator configured for employing the Golay sequence to produce the at least one prefix, each of the at least one prefix comprising M symbols.

77. The apparatus recited in claim 76, wherein the Golay sequence generator is configured to generate at least one of a set of complementary Golay codes.

78. The apparatus recited in claim 76, further comprising a Golay receiver adapted for receiving the sub-slot transmission sequence and processing the at least one prefix for performing at least one of channel tracking, timing-offset tracking, and frequency-offset tracking.

79. The apparatus recited in claim 76, further comprising a postfix generator configured to produce at least one postfix, each of the at least one postfix comprising M symbols.

80. A system configured for generating a sub-slot transmission sequence comprising at least one prefix, wherein the system employs an inverse Fourier transform of length N, the apparatus comprising:
a Golay sequence generation means configured for generating a Golay sequence comprising M symbols wherein M<N, wherein the Golay sequence generation means is configured to select M with respect to channel delay in a multipath channel,
a sub-slot sequence generation means configured for generating a Golay-code modulated data sequence having a sub-slot length of N-M symbols, and
a prefix generation means configured for employing the Golay sequence to produce the at least one prefix, each of the at least one prefix comprising M symbols.

81. The system recited in claim 80, wherein the Golay sequence generation means is configured to generate at least one of a set of complementary Golay codes.

82. The system recited in claim 80, further comprising a Golay receiving means adapted for receiving the sub-slot transmission sequence and processing the at least one prefix for performing at least one of channel tracking, timing-offset tracking, and frequency-offset tracking.

83. The system recited in claim 80, further comprising a postfix generation means configured to produce at least one postfix, each of the at least one postfix comprising M symbols.

84. A network device, comprising:
- a Golay code generator configured to produce at least one Golay code,
- a sequence generator configured for generating at least one of a plurality of sequences, each of the plurality of sequences denoting one of a plurality of transmission modes,
- a spreader configured for spreading at least one of the plurality of sequences with the at least one Golay code for producing at least one spread sequence, and selecting the at least one spread sequence in response to at least one transmission mode to generate at least one of a SYNC field and an SFD field, and
- a wireless interface configured to transmit a signal comprising the at least one of SYNC field and SFD field.

85. A network device, comprising:
- a wireless interface configured to receive a signal,
- a Golay code generator configured to produce at least one Golay code, and
- a despreader configured for employing the at least one Golay code for despreading at least one of a SYNC field and an SFD field in the received signal to produce a despread sequence, the despreader further comprising a sequence detector configured for determining which of a plurality of transmission modes the despread sequence denotes.

86. A network device, comprising:
- a Golay code generator configured to produce a pair of complementary Golay codes, and
- a sequence generator configured for generating a channel-estimation sequence,
- a spreader configured for spreading the channel-estimation sequence with the pair of complementary Golay codes for producing at least one spread sequence configured for producing at least one Dirac pulse when combining matched-filter outputs at another network device, and
- a wireless interface configured to transmit, to the other network device, a signal comprising the at least one spread sequence.

87. A network device, comprising:
- a wireless interface configured to receive a signal,
- a Golay code generator configured to produce at least one Golay code corresponding to at least one of a plurality of marker codes periodically inserted between data slots in the received signal, and
- a synchronization engine configured for employing the at least one Golay code to process the plurality of marker codes for performing at least one of a set of functions, comprising tracking, timing acquisition, frequency acquisition, and channel estimation.

88. A network device configured for generating a sub-slot transmission sequence with at least one prefix, wherein the network device employs an inverse Fourier transform of length N, the network device comprising:
- a Golay sequence generator configured for generating a Golay sequence comprising M symbols wherein M<N, wherein the Golay sequence generator is configured to select M with respect to channel delay in a multipath channel,
- a sub-slot sequence generator configured for generating a Golay-code modulated data sequence having a sub-slot length of N-M symbols,
- a prefix generator configured for employing the Golay sequence to produce the at least one prefix, each of the at least one prefix comprising M symbols, and
- a wireless interface configured to transmit the sub-slot transmission sequence with the at least one prefix.

* * * * *